United States Patent [19]
Fukuzumi et al.

[11] Patent Number: 6,020,643
[45] Date of Patent: Feb. 1, 2000

[54] SEMICONDUCTOR MEMORY DEVICE HAVING CONTACT HOLES OF DIFFERING STRUCTURE

[75] Inventors: Yoshiaki Fukuzumi; Yusuke Kohyama, both of Yokosuka, Japan

[73] Assignee: Kabushiki Kaisha Toshiba, Kawasaki, Japan

[21] Appl. No.: 09/115,228

[22] Filed: Jul. 14, 1998

[30] Foreign Application Priority Data

Jul. 16, 1997 [JP] Japan ..................................... 9-190802

[51] Int. Cl.[7] .......................... H01L 23/48; H01L 27/108; H01L 29/76; H01L 23/52
[52] U.S. Cl. ........................... 257/774; 257/296; 257/306; 257/758
[58] Field of Search ..................................... 257/306, 296, 257/314, 758, 774

[56] References Cited

U.S. PATENT DOCUMENTS 5,317,193  5/1994  Watanabe ............................... 257/774

OTHER PUBLICATIONS

Kang, H.K., et al; *Highly Manufacturable Process Technology for Reliable 256 Mbit and 1 Gbit DRAMs*, 94 IEDM 635–638, 1994.

*Primary Examiner*—Steven H. Loke
*Attorney, Agent, or Firm*—Finnegan, Henderson, Farabow, Garrett & Dunner, L.L.P.

[57] ABSTRACT

A semiconductor memory device comprises a semiconductor substrate, a first conducting layer formed above the main surface of the semiconductor substrate, a second conducting layer formed above the first conducting layer through a first insulating layer and connected to the first conducting layer through a first via-conductor formed in a first contact hole formed in the first insulating layer, and a third conducting layer formed beneath the second conducting layer through a second insulating layer and connected to the second conducting layer through a second via-conductor formed in a second contact hole formed in the second insulating layer, in which an angle formed by a tangent to an inner wall of the first contact hole and a normal to the first conducting layer at a portion of the first conducting layer at which the first contact hole is in contact with the first conducting layer, is larger than an angle formed by a tangent to an inner wall of the second contact hole and a normal to the third conducting layer at a portion of the third conducting layer at which the second contact hole is in contact with the third conducting layer. By virtue of this structure, it is possible to avoid influence of electrical potential variation upon the first conducting layer in the manufacturing process.

12 Claims, 26 Drawing Sheets

SEMICONDUCTOR MEMORY DEVICE HAVING CONTACT HOLES OF DIFFERING STRUCTURE

BACKGROUND OF THE INVENTION

The present invention relates to a highly integrated semiconductor memory device and a method of manufacturing the same.

With the recent tendency toward high integration of semiconductor memory devices, semiconductor memory devices such as a DRAM have been miniaturized. With the miniaturization, a capacitor area responsible for storing charges tends to be reduced, leading to a reduction in capacitance. As the capacitance is reduced, reading performance by a sense amplifier is degraded and a capacitor storage electrode is negatively affected by electron-hole pairs generated by an α ray, with the result that memory data is destroyed. Such a so-called soft error has been arisen as a significant problem.

To prevent deterioration in reading performance, capacitance is tried to be increased. On the other hand, to increase a soft-error resistance, it is considered useful that a contact area of a diffusion layer in contact with a capacitor storage electrode is reduced to thereby decrease an efficiency in collecting α ray-induced charges.

To satisfy these requirements simultaneously, a stacked type semiconductor memory device has been proposed. The stacked type semiconductor memory device employs a stacked capacitor structure in place of a conventionally-used capacitor structure in which the diffusion layer itself is used as the capacitor storage electrode (storage node electrode). The stacked capacitor is formed of a capacitor storage electrode stacked on a semiconductor substrate. To ensure the capacitor area, a COB (capacitor over bit-line) structure has been employed in practice in DRAMs of 16M bit generation. In the COB structure, a capacitor is formed over the bit line layer.

The semiconductor memory device of a stacked type cell structure having the capacitor storage electrode formed on the bit line is disclosed in, for instance, "Highly Manufacturable Process Technology for Reliable 256M bit and 1 G bit DRAMs", H. K. Kang et al. IEDM Technical Digest p635 (1994).

Hereinbelow, the present invention will be explained with reference to FIG. 1. Reference symbol MC represents a memory cell region and reference symbol PC represents a peripheral circuit region in FIG. 1.

A conventionally-used DRAM having a stacked capacitor of a COB structure has an element isolating region 102, which is formed in the memory cell region on a semiconductor substrate 101, and an active region which is sandwiched by the element isolating regions 102. The active region of the DRAM includes a gate electrode (word line) 104a and first conductivity type source/drain regions 105a. The gate electrode 104a is formed in a predetermined position on a main surface of the semiconductor substrate 101, via a gate insulating film 103. The first conductivity type source/drain regions 105a are formed on a predetermined region of a second conductivity type in the main surface of the semiconductor substrate 101.

Furthermore, the DRAM has a passing word line (gate electrode) 104b which is formed on the element isolating region 102, a gate electrode (word line) 104a, an insulating film 106 which covers the passing word line 104b, a capacitor storage electrode (storage node electrode) 113 which is connected to one of the source/drain regions 105a close to the gate electrode (word line) 104a via a buried electrode 107, and a bit line 110a which is connected to the other one of the source/drain regions 105a via the buried electrode 107.

Furthermore, the DRAM has capacitor upper electrodes (cell plate) 115a and 115b (which are formed as the same layer), and a conducting layer (first wiring layer) 123b which is present in the peripheral circuit region. The capacitor upper electrodes 115a and 115b are formed on the capacitor storage electrode (storage node electrode) 113 with a capacitor dielectric film 114 interposed therebetween. The conducting layer (first wiring layer) 123b is connected to the capacitor upper electrode (cell plate) 115b by way of a buried electrode 120 with an interlayer insulating film 116 interposed between them.

In this case, a transistor TR is formed of the gate insulating film 103, the gate electrode (word line) 104a and the source/drain regions 105a. In the DRAM having a stacked capacitor of the COB structure, the bit line 110a is formed underneath the capacitor storage electrode (Storage node electrode) 113, as shown in FIG. 1.

Now, a conventionally-employed method of manufacturing the semiconductor memory device of this type will be explained below. Since a feature of the present invention resides in the steps after formation of the capacitor upper electrodes (cell plates) 115a, 115b, there will be briefly explained the steps before the step of forming capacitor upper electrodes (cell plates) 115a, 115b, referring to conventionally-employed steps shown in FIGS. 2–7.

As shown in FIG. 2, the element isolating region 102 is first formed by LOCOS (Local Oxidation of Silicon) on a main surface of a p-type semiconductor substrate 101 within the memory cell region. Second, as shown in FIG. 3, a gate oxide film 103, gate electrodes (word lines) 104a, 104b, N-type source/drain regions 105a, and an insulating film 106 covering the gate electrodes (word lines) 104a, 104b, are sequentially formed. Subsequently, a buried electrode 107 is formed in a self-alignment manner with the insulating film 106 by depositing the conductive film.

Then, an interlayer insulating film 108 is formed over the entire surface. A contact hole 109a is formed in the interlayer insulating film 108. Thereafter, a bit line 110a is formed of tungsten (W) over an entire surface including an inner surface of the contact hole 109a.

As shown in FIG. 4, an interlayer insulating film 111 is formed over the entire surface. A contact hole 112 is formed extending through the interlayer film 111 and the interlayer film 108. Subsequently, a capacitor storage electrode (storage node electrode) 113, a capacitor dielectric film 114, and a capacitor upper electrodes (cell plates) 115a, 115b are successively formed.

As shown in FIG. 5, an interlayer insulating film 116 is deposited over the entire surface of the substrate. The surface of the interlayer insulating film 116 is polished flat by CMP (Chemical Mechanical Polishing).

To permit the capacitor upper electrodes (cell plates) 115a, 115b to electrically connect to the outside, a contact hole 117 is formed by RIE (Reactive Ion Etching). Subsequently, a barrier metal layer 118 (a Ti/TiN stacked film) and a conductive film 119 (tungsten, W) are deposited inside the contact hole 117 and on the interlayer insulating film 116. CMP is applied using the interlayer insulating film 116 as a stopper. As a result, a buried electrode 120 is formed.

As shown in FIG. 6, conducting layers (wiring layers) 123a, 123b are formed of a barrier metal layer 121 and a conducting layer 122 (aluminium, etc). Then, an interlayer insulating film 124 is deposited as shown in FIG. 7. A contact hole 125 is formed at a desired position. Furthermore, a barrier metal layer 126 and a conducting layer 127 (aluminium etc.) are deposited to form a conducting layer (wiring layer) 128. Subsequently, a protection film 129 (not shown) is formed, on which an opening of a pad electrode portion is further formed. In this manner, the semiconductor memory device is accomplished. Note that the contact hole on the upper electrode is formed by anisotropic etching, namely, RIE.

As described, in the conventionally-employed semiconductor memory device and the manufacturing method thereof, a plurality of contact holes different in depth, such as the contact hole 117 between the conducting layer (first wiring layer) 123b and the capacitor upper electrode (cell plate) 115b, and a contact hole (not shown) between the same layer as the conducting layer 123b (first wiring layer) and the same layer as the bit line 110a, are formed simultaneously in the same method. It follows that the contact hole shallow in depth inevitably receives impact by accelerated ions even after a desired over-etching is applied thereto. The impact lasts until a desired over-etching to the most deepest contact hole is completed.

During the contact hole formation step, the capacitor upper electrodes (cell plates) 115a, 115b are electrically floated. Therefore, charges tend to be accumulated. The impact of the accelerated ions changes electric potential of one of electrodes of the capacitor, generating a potential difference between the capacitor upper electrodes (cell plates) 115a, 115b and the capacitor storage electrode (storage node electrode) 113. As a result, the capacitor dielectric film 114 is damaged by electrostatic breakage etc.

BRIEF SUMMARY OF THE INVENTION

A first object of the present invention is to provide a method of manufacturing a semiconductor memory device including a step of forming a plurality of contact holes different in depth with an proper over-etching amount, and to provide a semiconductor memory device free from undesirable etching damages.

A second object of the present invention is to provide a semiconductor memory device free from damages upon a capacitor dielectric film and improved in yield and reliability by preventing electrical potential variation of the capacitor upper electrode (cell plate) in a contact hole formation step, and to provide a method of the semiconductor memory device.

To attain the objects, a semiconductor memory device according to a first aspect of the present invention comprises:
a semiconductor substrate having a main surface;
a first conducting layer formed above the main surface of the semiconductor substrate;
a second conducting layer formed above the first conducting layer with a first insulating layer interposed therebetween and connected to the first conducting layer through a first via-conductor formed in a first contact hole formed in the first insulating layer; and
a third conducting layer formed beneath the second conducting layer with a second insulating layer interposed therebetween and connected to the second conducting layer through a second via-conductor formed in a second contact hole formed in the second insulating layer;
in which a smaller angle of two angles formed by a tangent to an inner wall of the first contact hole and a normal to the first conducting layer at a portion of a surface of the first conducting layer at which the first contact hole is in contact with the first conducting layer, is larger than a smaller angle of two angles formed by a tangent to an inner wall of the second contact hole and a normal to the third conducting layer at a portion of a surface of the third conducting layer at which the second contact hole is in contact with the third conducting layer.

The first conducting layer can serve as one of two electrodes of a capacitor formed on the main surface of the semiconductor substrate.

It is desired to further comprise means for electrically connecting the first conducting layer to the semiconductor substrate which operates when a voltage over a predetermined voltage is applied to the first conducting layer.

More specifically, it is desired to further comprise a protection diode formed between the second via-conductor and the semiconductor substrate.

It is desirable that the first via-conductor is formed of a different material from a material of the second via-conductor.

A semiconductor memory device according to a second aspect of the present invention comprises:
a semiconductor substrate having a main surface;
a capacitor storage electrode formed above the main surface of the semiconductor substrate;
a capacitor upper electrode formed above the capacitor storage electrode through a capacitor dielectric film;
a first wiring layer formed above the capacitor electrode with a first insulating layer interposed therebetween and connected to the capacitor upper electrode through a first via-conductor formed in a first contact hole formed in the first insulating layer; and
a second wiring layer formed beneath the first wiring layer with a second insulating layer interposed therebetween and connected to the first wiring layer through a second via-conductor formed in a second contact hole formed in the second insulating layer,
in which a smaller angle of two angles formed by a tangent to an inner wall of the first contact hole and a normal to the capacitor upper electrode at a portion of a surface of the capacitor upper electrode at which the first contact hole is in contact with the capacitor upper electrode, is larger than a smaller angle of two angles formed by a tangent to an inner wall of the second contact hole and a normal to the second wiring layer at a portion of the surface of the second wiring layer at which the second contact hole is in contact with the second wiring layer.

The second wiring layer may be the semiconductor substrate.

It is desired to further comprise means for electrically connecting the capacitor upper electrode to the semiconductor substrate which operates when a voltage over a predetermined voltage is applied to the capacitor upper electrode.

More specifically, it is desired to further comprise a protection diode formed between the second via-conductor and the semiconductor substrate.

It is desirable that the first via-conductor is formed of a different material from a material of the second via-conductor.

A method of manufacturing a semiconductor memory device according to a third aspect of the present invention comprises the steps of:
forming a first conducting layer above a main surface of a semiconductor substrate;

forming a third conducting layer above the main surface of the semiconductor substrate and in a region different from a region in which the first conducting layer is formed;

forming a first interlayer insulating film on the first conducting layer;

forming a first contact hole in the first interlayer insulating film;

forming a first via-conductor in the first contact hole;

forming a second interlayer insulating film on the third conducting layer;

forming a second contact hole in the second interlayer insulating film;

forming a second via-conductor in the second contact hole; and forming a second conducting layer on the first interlayer insulating film and the second interlayer insulating film, the second conducting layer being connected to the first conducting layer through the first via-conductor and connected to the third conducting layer through the second via-conductor;

in which the step of forming the first contact hole includes a step of forming at least a lower area of the first contact hole by an etching method free from generating electrical potential variation to the first conducting layer; and the step of forming the second contact hole includes a step of forming at least a lower area of the second contact hole by an anisotropic etching method.

The first conducting layer is in the same layer as a capacitor upper electrode of a capacitor formed on the semiconductor substrate, and the method further comprises the steps of:

forming a gate electrode insulatively on a second conductivity type region in the semiconductor substrate;

forming a source and a drain region of a first conductivity type in the second conductivity type region, using the gate electrode as a mask;

forming a third interlayer insulating film in which the gate electrode is to be buried, on the semiconductor substrate;

forming a bit line to be connected to one of the source and the drain region, on the third interlayer insulating film;

forming a fourth interlayer insulating film on the third insulating film so as to bury a bit line therein;

forming a capacitor storage electrode to be connected to the other one of the source and the drain region, on the fourth interlayer insulating film; and forming a capacitor upper electrode above the capacitor storage electrode with a capacitor dielectric film interposed therebetween.

It is desirable that, in the step of forming the first contact hole, isotropic etching be used as the etching method free from generating electrical potential variation.

It is desired to further comprise a step of forming a device electrically connecting the capacitor upper electrode to the semiconductor substrate which operates when a voltage over a predetermined voltage is applied to the capacitor upper electrode.

More specifically, it is desirable to further comprise a step of forming a protection diode between the second via-conductor and the semiconductor substrate which operates when a voltage over a predetermined voltage is applied to the capacitor upper electrode.

It is desirable that the step of forming the first via-conductor in the first contact hole includes a step of burying a first conductive material in the first contact hole, and the step of forming a second via-conductor in the second contact hole includes a step of burying a second conducting material different from the first conducting material, in the second contact hole.

A method of forming a semiconductor memory device according to a fourth aspect of the present invention comprising the steps of:

forming a capacitor storage electrode above a semiconductor substrate;

forming a capacitor dielectric film on the capacitor storage electrode;

forming a capacitor upper electrode on the capacitor dielectric film;

forming an interlayer insulating film on the capacitor upper electrode; and forming an opening portion whose opening is positioned on the capacitor upper electrode, in the interlayer insulating film, in which the step of forming an opening portion includes a step of applying etching free from generating electrical potential variation to at least a lower portion of the interlayer insulating film, and include a step of applying anisotropic etching to at least a portion other than the lower portion of the interlayer insulating film, to form the opening portion.

It is desirable that, in the step of forming an opening, isotropic etching should be used as the etching free from generating electrical potential variation.

It is desired to further comprise a step of forming a device electrically connecting the capacitor upper electrode to the semiconductor substrate which operates when a voltage over a predetermined voltage is applied to the capacitor upper electrode.

More specifically, it is desired to further comprise a step of forming a protecting diode between the second via-conductor and the semiconductor substrate which operates when a voltage over a predetermined voltage is applied to the capacitor upper electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
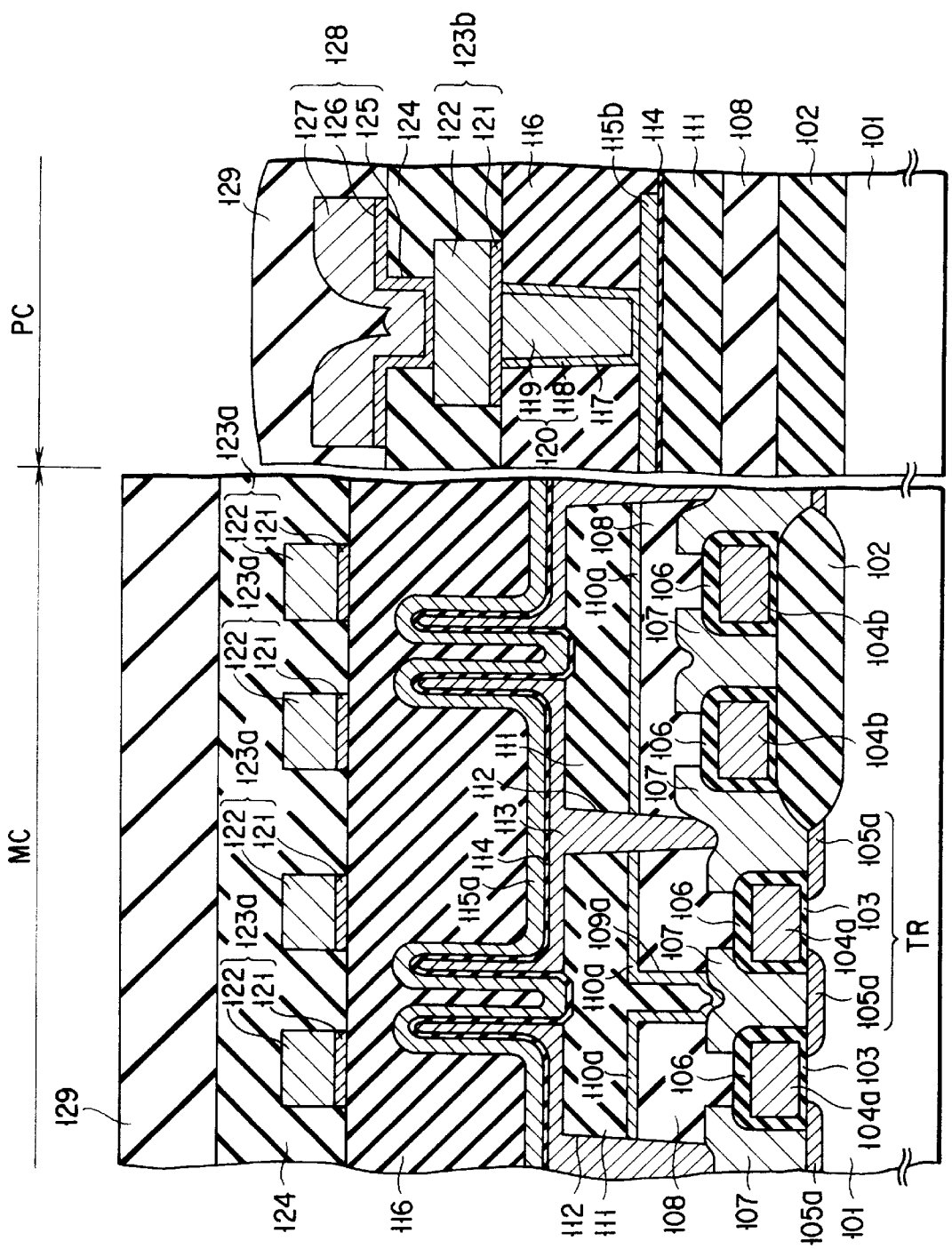
FIG. 1 is a cross-sectional view of a DRAM having a conventional stacked type capacitor.
Figure 2:
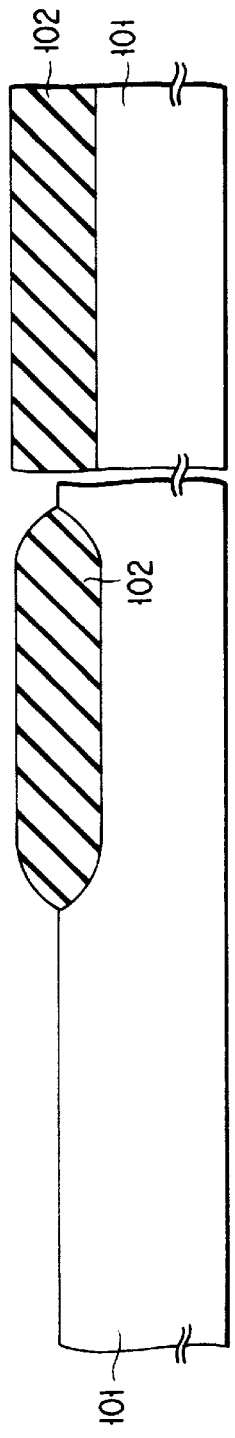
FIGS. 2–7 are cross-sectional views of a DRAM sequentially showing manufacturing steps of the DRAM shown in FIG. 1.
Figure 3:
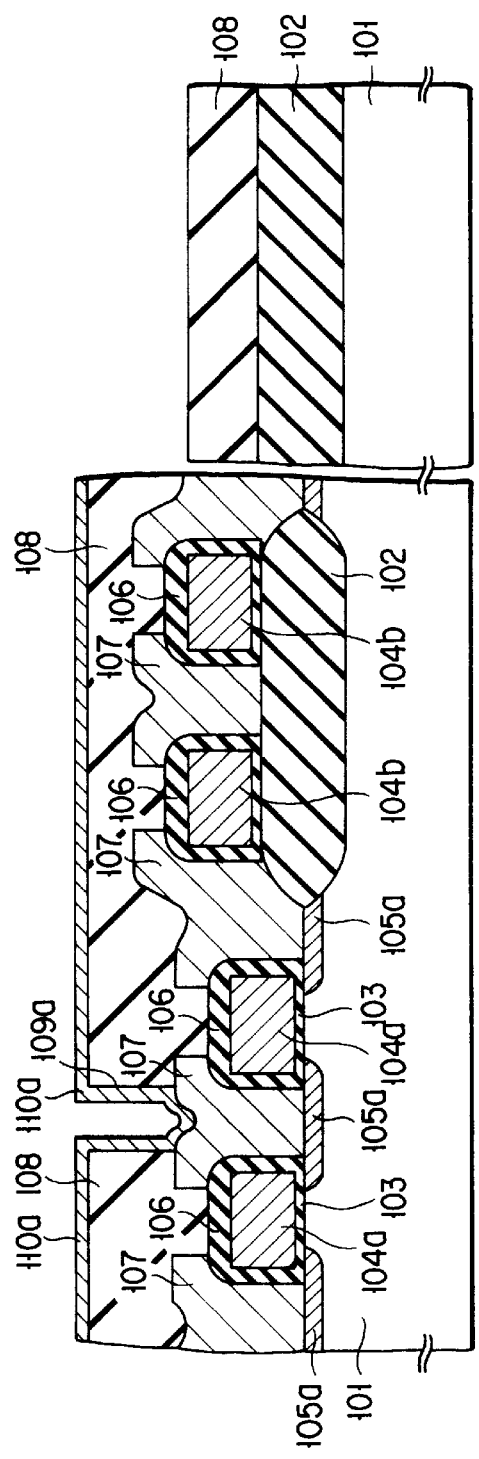
Figure 4:
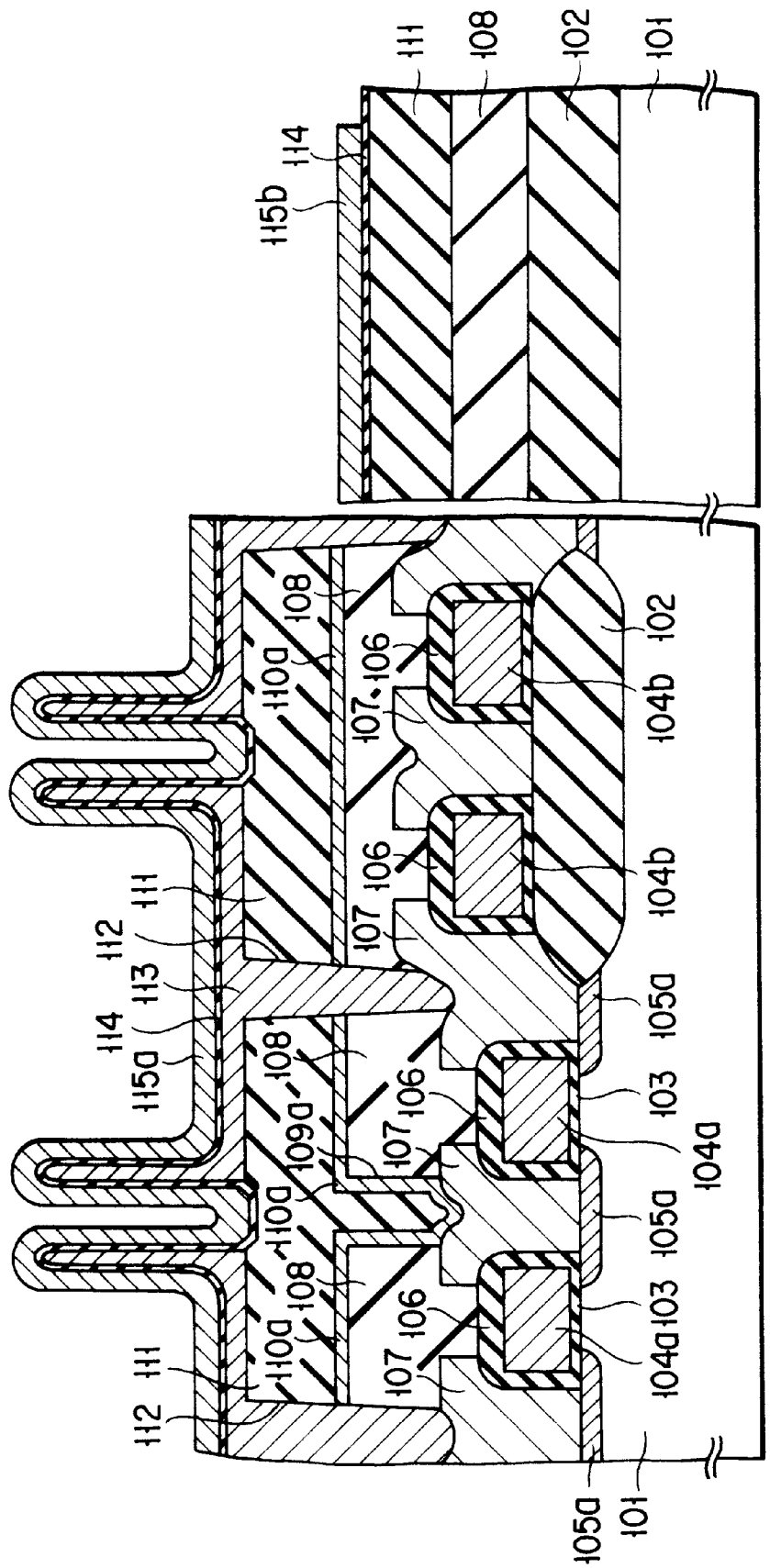
Figure 5:
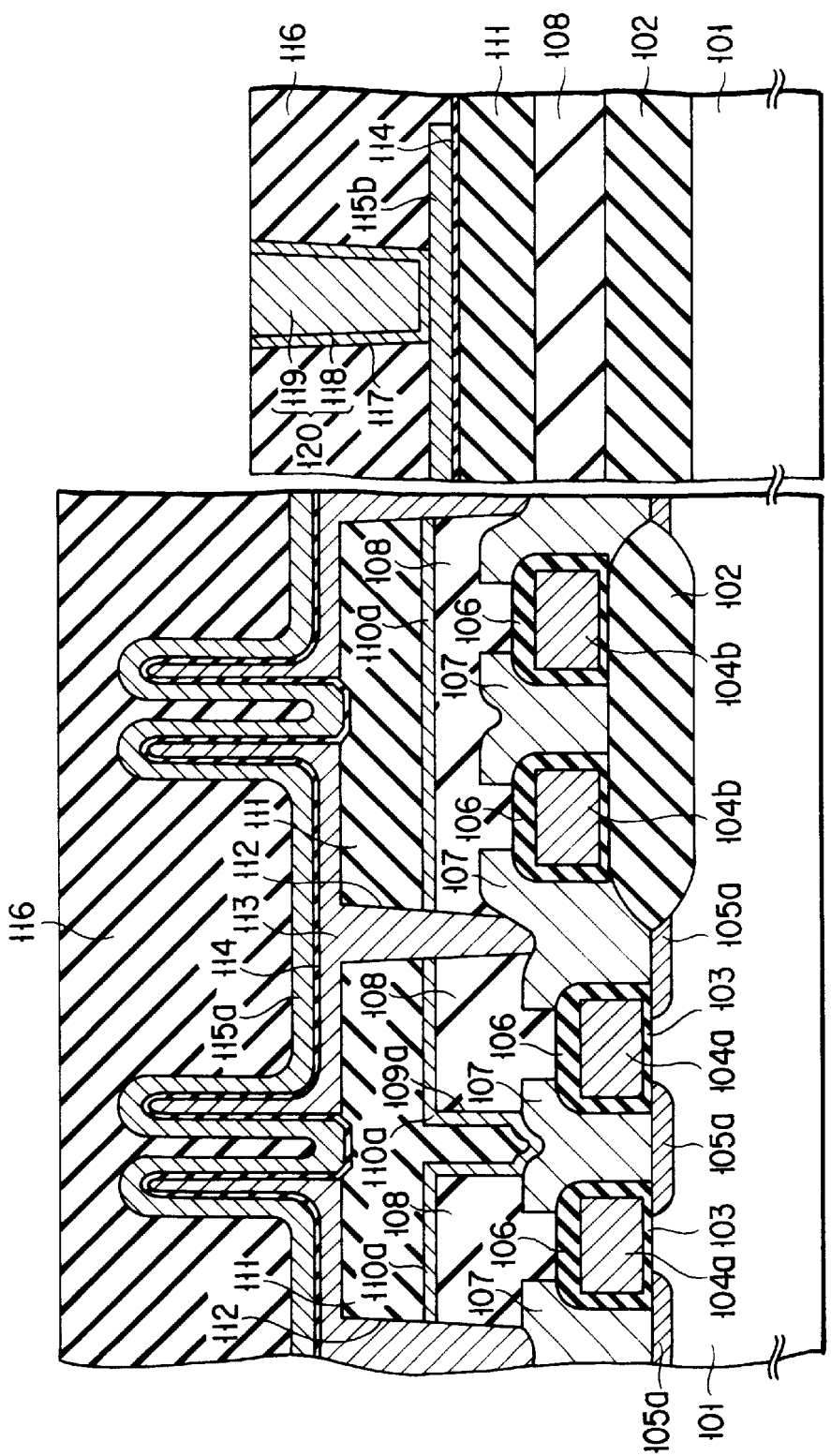
Figure 6:
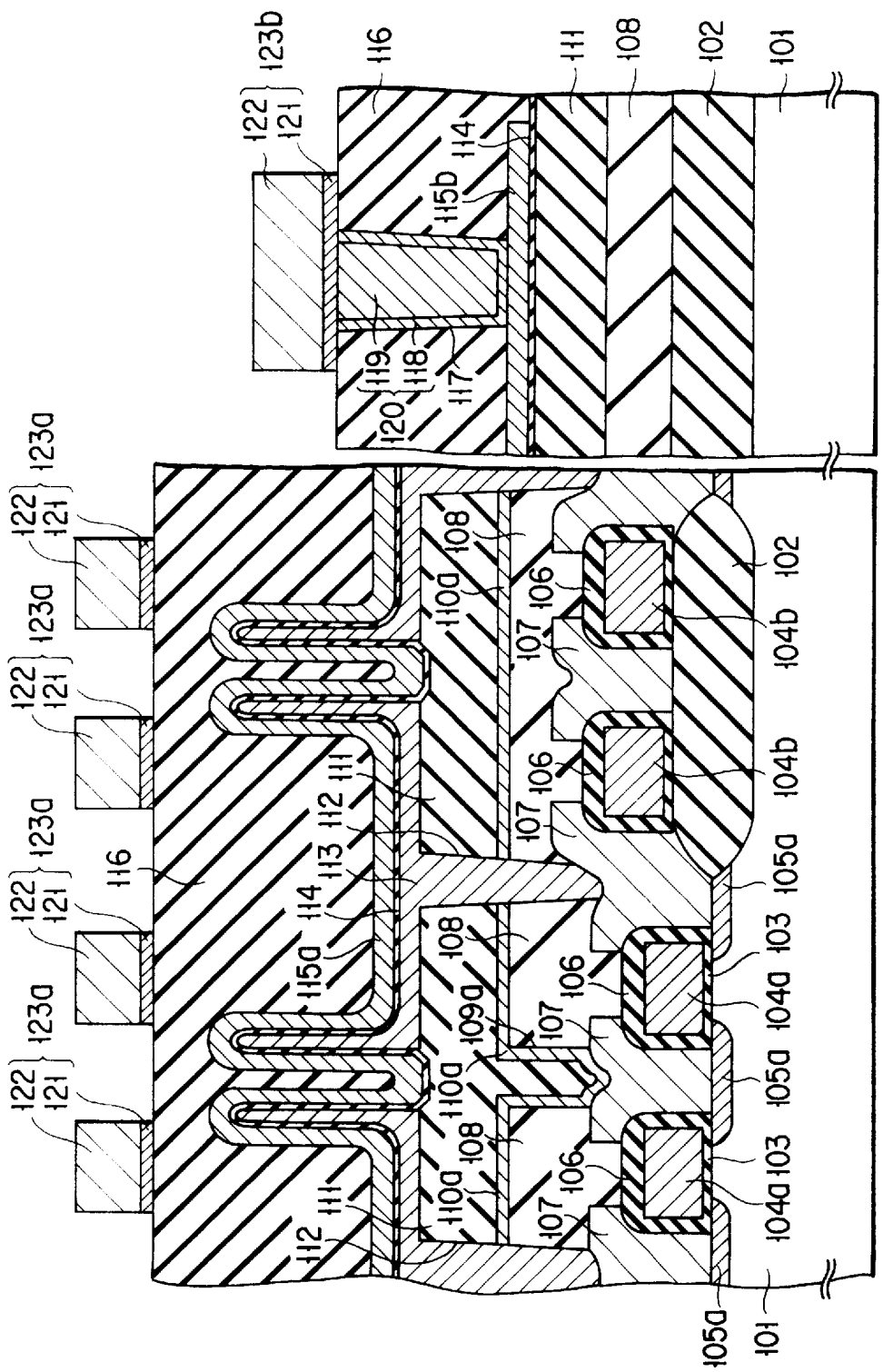
Figure 7:
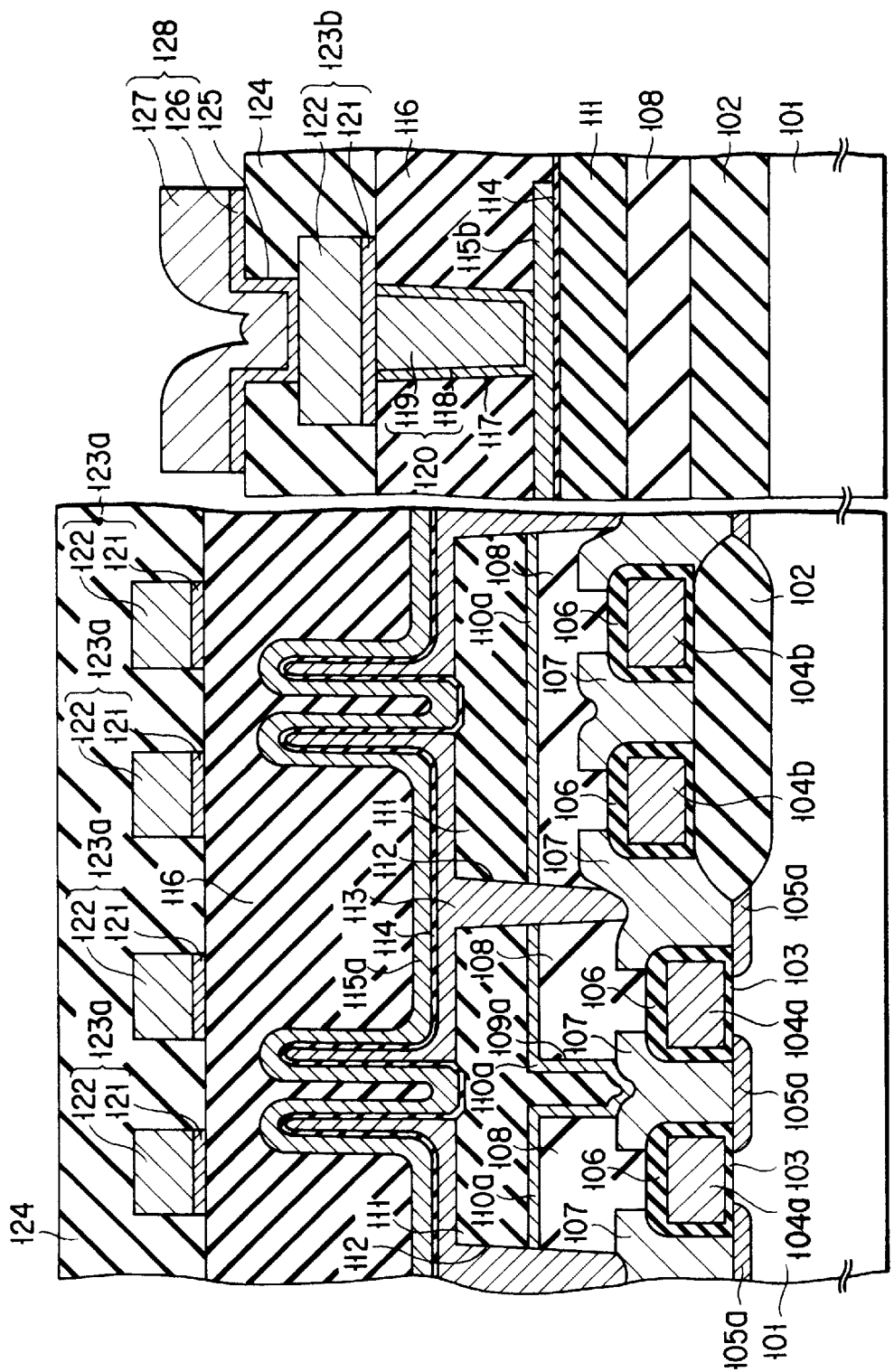

Now, embodiments of the present invention will be explained with reference to the accompanying drawings. Each of the drawings shows a cross-sectional view of a stacked-type semiconductor memory device of the present invention. Reference symbol MC in the drawings represents a memory-cell integrated region and reference symbol PC represents a peripheral circuit formation region. A transistor constituting a memory cell is indicated by TR and a diode formed in the peripheral circuit region by DD. Through the drawings, the same portions are indicated by the same reference symbols.

(Embodiment 1)

Figure 8:
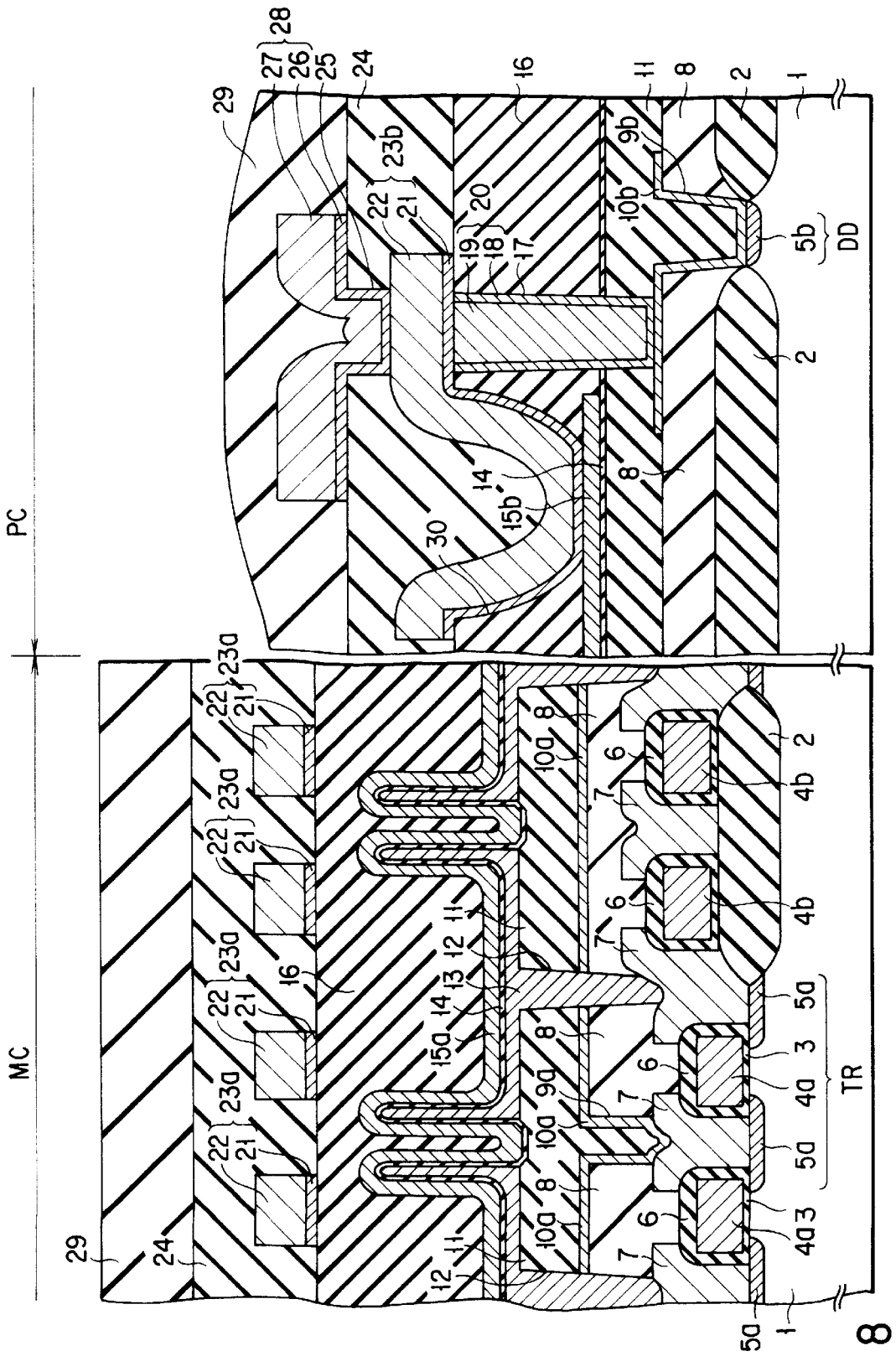
FIG. 8 is a cross-sectional view of a DRAM having a stacked capacitor according to Embodiment 1 of the present invention.

FIG. 8 is a cross-sectional view of a DRAM having a stacked capacitor according to Embodiment 1 of the present invention.

A feature of the DRAM of Embodiment 1 resides in that a contact hole 30 connecting between a capacitor upper electrode (cell plate) 15b and a conducting layer (first wiring layer) 23b is formed by isotropic etching such as wet etching or CDE (Chemical Dry Etching). The isotropic etching is advantageous in that it provides no electrical potential variation to the capacitor upper electrode (cell plate) 15b since no accelerated ion collision occurs. Therefore, the contact hole 30 of the semiconductor device has a cone-shaped opening. Another feature of the semiconductor device resides in that the capacitor upper electrode 15b is electrically connected to a semiconductor substrate 1 via a capacitor protecting diode DD.

FIGS. 9–14 are cross-sectional views of the DRAM shown in FIG. 8 sequentially showing manufacturing steps thereof.

Referring to these drawings, there will be described the difference between the manufacturing method of the present invention and the aforementioned conventional method. In Embodiment 1, the memory cell region is manufactured simultaneously with the peripheral circuit region in the same manner as in conventionally-employed manufacturing steps, as described below.

Figure 9:
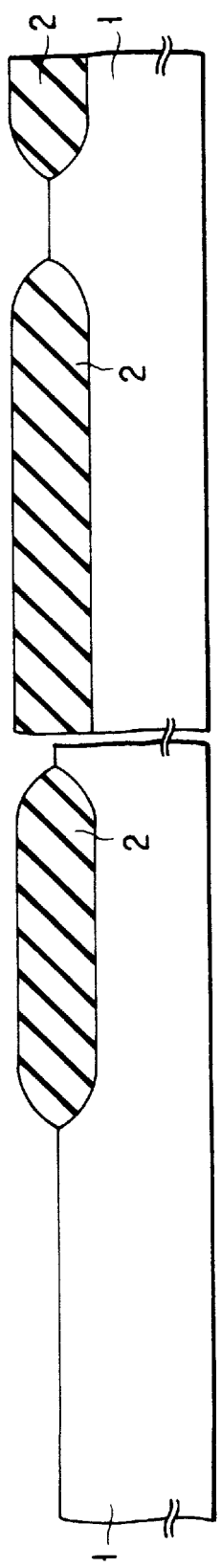
FIGS. 9–14 are cross-sectional views of a DRAM sequentially showing manufacturing steps of the DRAM according to Embodiment 1.

In the first place, as shown in FIG. 9, an element isolating region 2 is formed by LOCOS at a predetermined position not only in the memory-cell region but also the peripheral circuit region on the main surface of, for example, a P-type semiconductor substrate 1.

Figure 10:
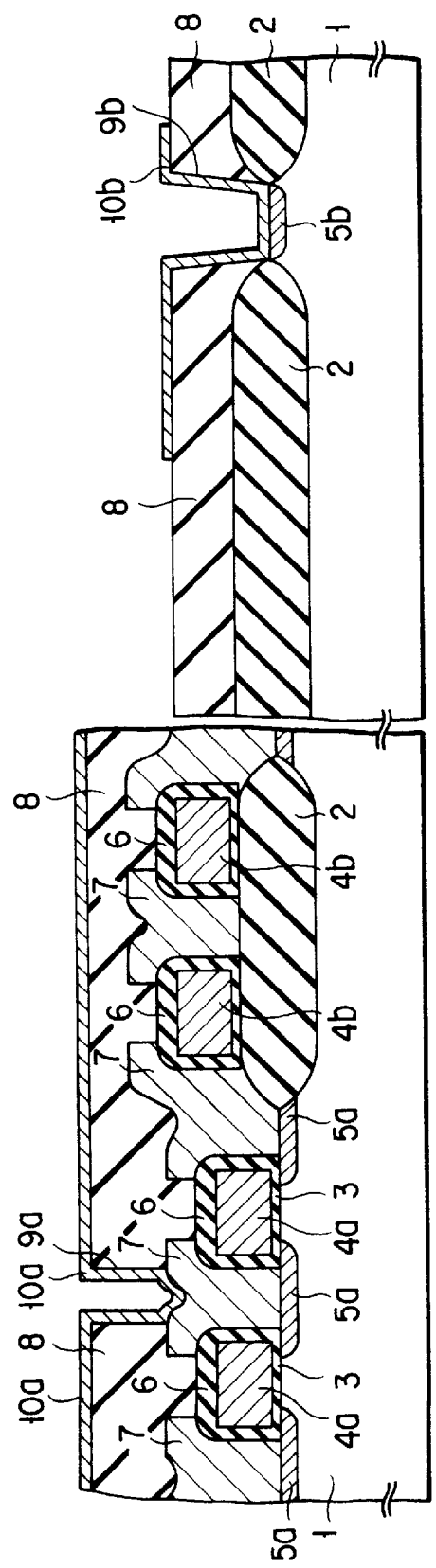

As shown in FIG. 10, a gate oxide film 3 by thermal oxidation and gate electrodes (word lines) 4a, 4b are formed in the memory cell region, followed by forming N-type source/drain regions 5a. At the same time, an N-type region 5b is formed by ion implantation in an active region sandwiched by the element isolating regions 2 in the peripheral circuit region. A diode is formed between the N-type region 5b and the P-type substrate 1.

Thereafter, an insulating film 6 covering the gate electrodes (word lines) 4a, 4b is formed in the memory cell region. Subsequently, a buried electrode 7 is formed in a self-alignment manner with the insulating film 6 and an interlayer insulating film 8 is formed over the entire surface. After contact holes 9a and 9b are formed in the interlayer insulating film 8, a bit line 10a is formed. At the same time, a conducting layer (second wiring layer) 10b is formed in the peripheral circuit region. The conducting layer 10b is formed on the inner surface of the contact hole 9b and connected to the N-type region 5b.

Figure 11:
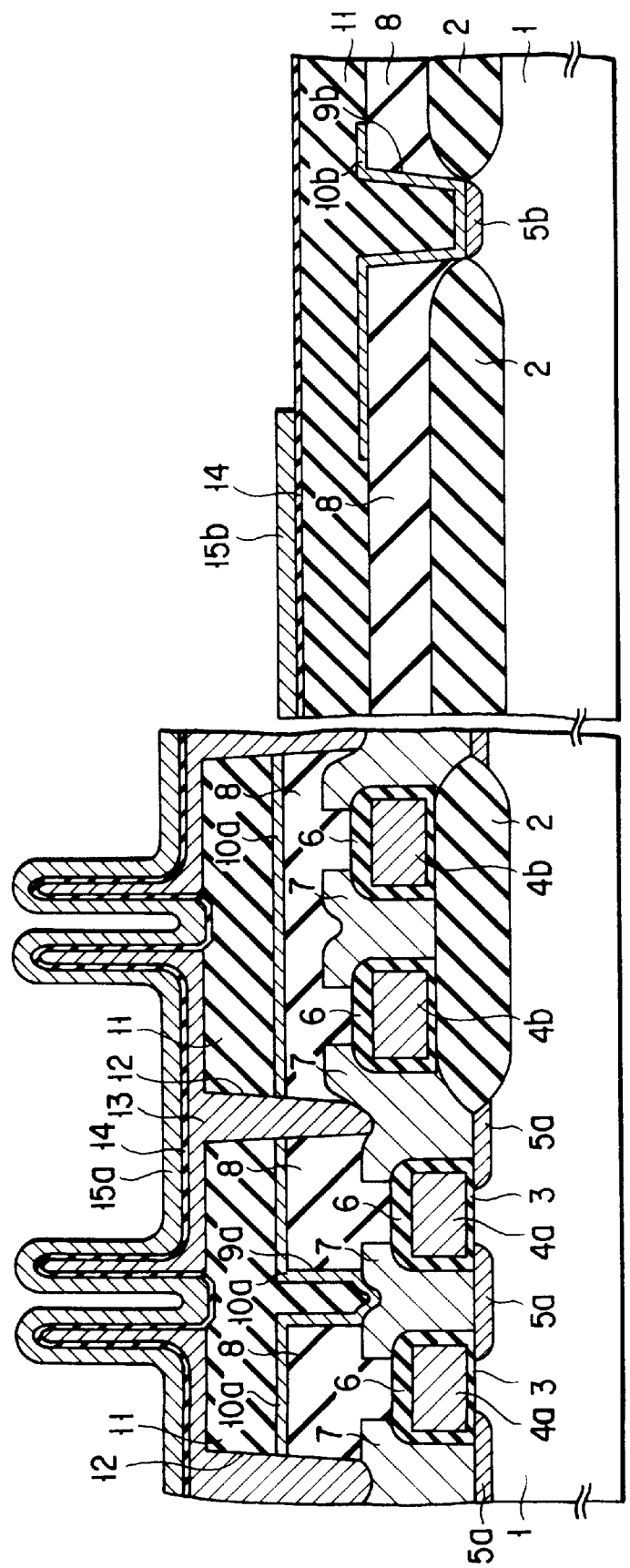

As shown in FIG. 11, an interlayer insulating film 11 is formed over the entire surface in the same manner as in the conventional method. A contact hole 12 is formed in the interlayer insulating film 11 and a capacitor storage electrode (storage node electrode) 13, a capacitor dielectric film 14, and capacitor upper electrodes (cell plates) 15a, 15b are formed sequentially.

Figure 12:
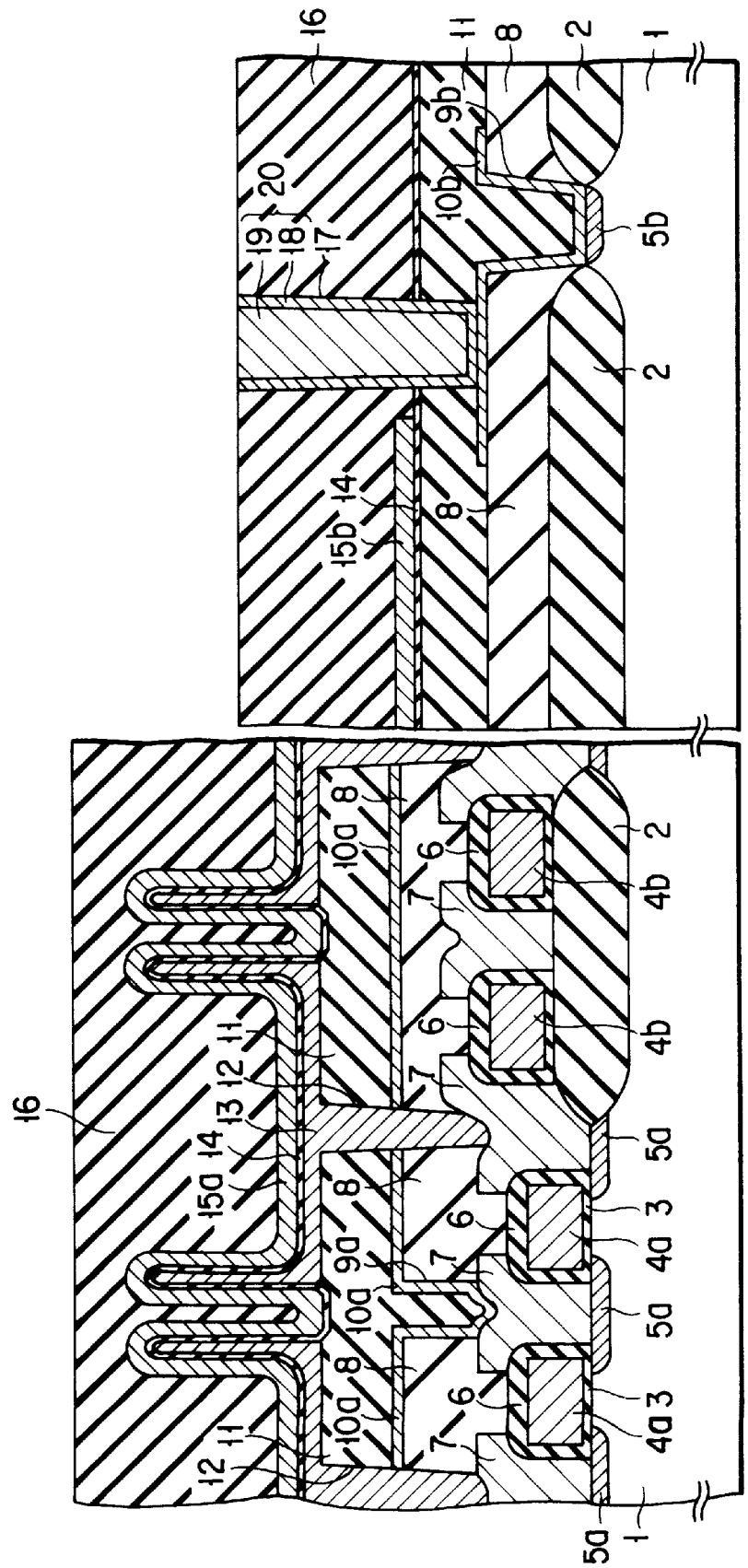

As shown in FIG. 12, an interlayer insulating film 16 is formed over the entire surface. A contact hole 17 is formed in the interlayer insulating film 16, and then, a barrier metal layer 18 and a buried electrode 20 (tungsten (W)) are formed.

Different from the conventional method, the buried electrode 20 is formed on, for example, the conducting layer (second wiring layer) 10b formed at the time the bit line 10a is formed, to avoid forming the buried electrode 20 on the capacitor upper electrode (cell plate) 15b.

Figure 13:
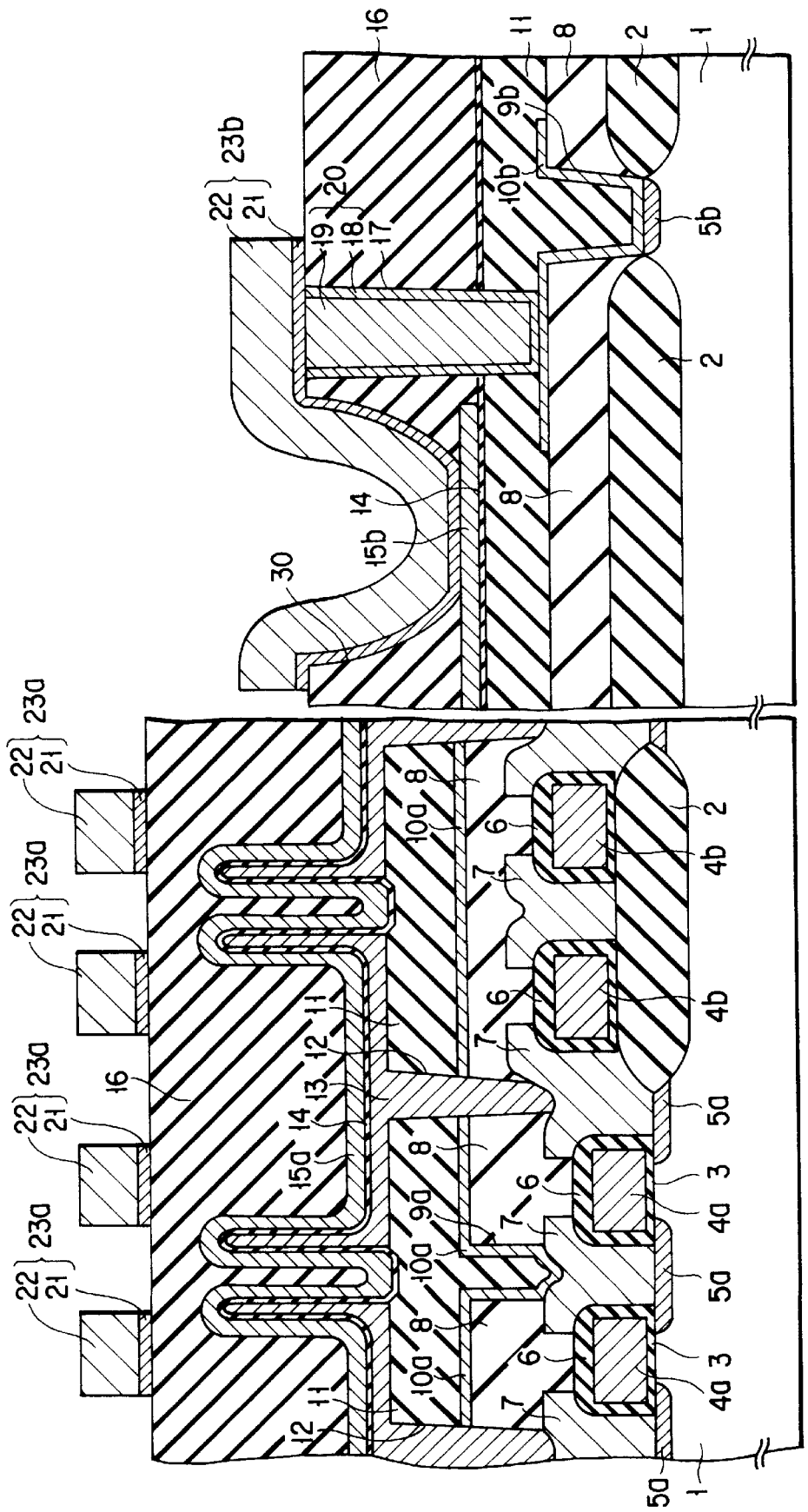

Then, as shown in FIG. 13, to form a contact hole 30, lithography is applied to the capacitor upper electrode (cell plate) 15b and the isotropic etching, such as wet etching or CDE (free from active ion collision) is performed. As a result, the contact hole 30 is formed. After a barrier metal layer 21 is deposited in the same manner as in the conventional method, a conducting layer 22 is formed by use of aluminium etc. Thereafter, a conducting layer (first wiring layer) 23b is formed by a general lithographic method and etching (RIE) in such a manner that the capacitor upper electrode (cell plate) 15b is electrically connected to the buried electrode 20.

Figure 14:
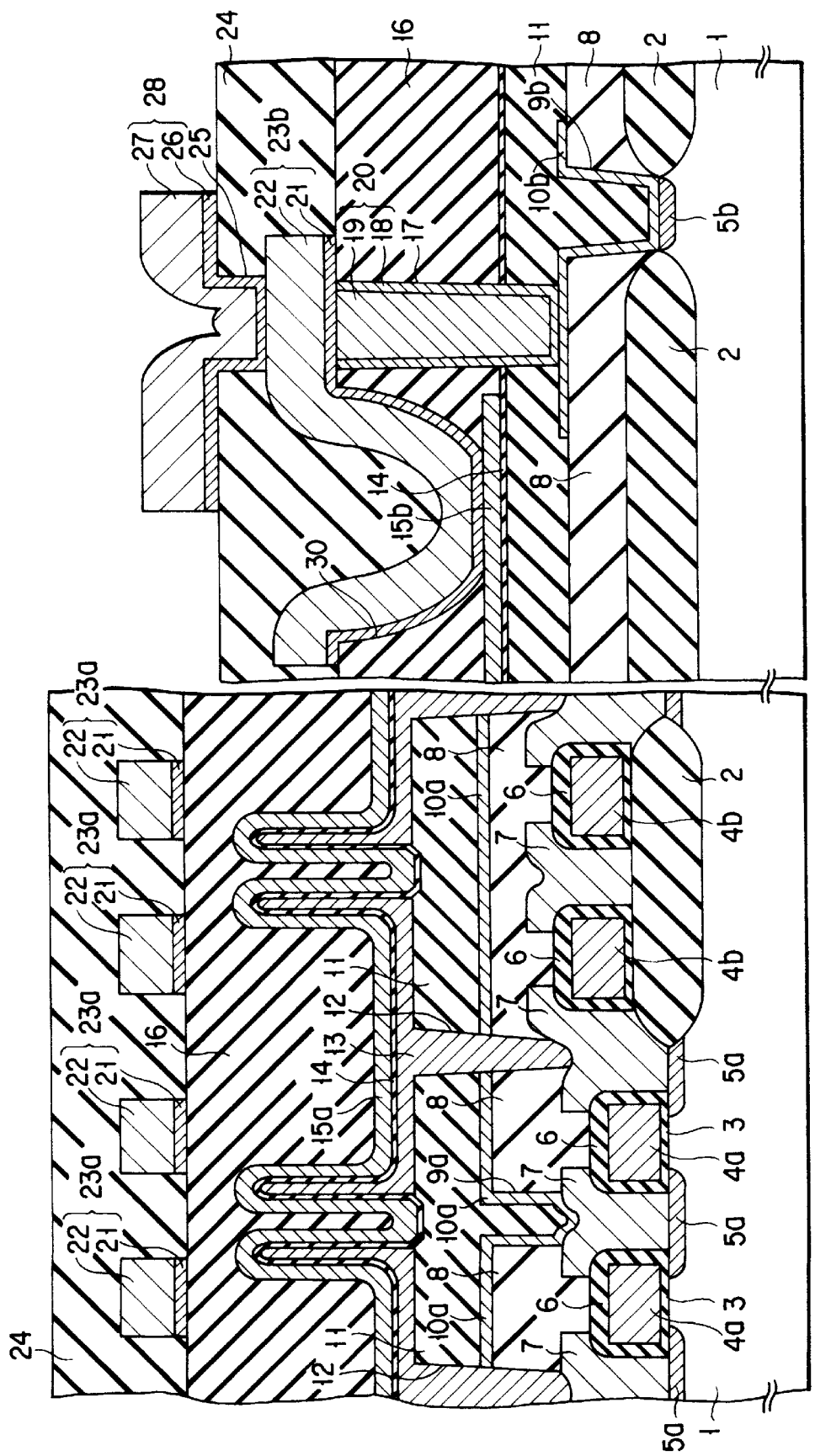

As shown in FIG. 14, an interlayer insulating film 24 is deposited and a contact hole 25 is formed at a predetermined position in the peripheral region. Furthermore, a barrier metal layer 26 and a conducting layer 27 (aluminium) are deposited to form a conducting layer (wiring layer ) 28. Subsequently, a protecting film 29 (not shown) is formed and a pad electrode portion is formed thereon, with the result that the semiconductor memory device is completed.

As described before, in Embodiment 1, isotropic etching and anisotropic etching are appropriately applied depending upon contact holes different in depth in Embodiment 1. As a result, it is possible to apply the isotropic etching and anisotropic etching with a proper over-etching amount. This is an effect (first effect) given by Embodiment 1.

A second effect resides in that the deterioration of the capacitor performance due to electrical variation of the capacitor upper electrode (cell plate) 15a is successfully prevented by forming the contact hole 30 (formed in the interlayer insulating film 16) by isotropic etching since isotropic etching is free from accelerated ion collision, bringing no electrical potential variation on the capacitor upper electrode (cell plate) 15b. Furthermore, in the case where wet etching is applied, the contact hole 30 is formed with less damage even if the over-etching amount differs depending upon processes since an etching selectivity to an underlying film is high compared to dry etching.

As a third effect, deterioration of capacitor performance due to electrical potential variation of the capacitor upper electrode (cell plate) 15a is successfully prevented by electrically connecting the capacitor upper electrode (cell plate) 15b to the semiconductor substrate 1 by way of the capacitor protecting diode DD.

More specifically, even if the conducting layer (first wiring layer) 23b underlying the contact hole 25 formed in FIG. 14 is electrically influenced by accelerated ion collision due to anisotropic etching performed in the later steps including a contact hole 25 formation step, the protecting diode can be broken down when potential increases higher than the breakdown voltage, forming a passage of carriers between the capacitor upper electrode (cell plate) 15b and the semiconductor substrate 1. By virtue of this, extra charges which have been generated on the capacitor upper electrode, are released toward the semiconductor substrate 1 through the diffusion layer 5b. Owing to the release, it is possible to prevent the deterioration of capacitor performance due to electrical potential variation of the capacitor upper electrode (cell plate) 15a.

As mentioned, a general anisotropic etching (RIE) can be employed in a contact formation step or a wiring formation step later and including the step of forming the contact hole without worrying about electrical potential variation of the capacitor upper electrode (cell plate) 15a.

The fourth effect resides in that the contact hole can be properly formed depending on each requirement for miniaturization level, buriability and electrical properties by using the etching techniques properly.

More specifically, contact holes must be formed in a very small opening diameter and at narrow intervals in the recent semiconductor memory devices. To satisfy these desires, anisotropic etching is suitable. However, as is the case of the contact hole to the upper electrode formed in the interlayer insulating film above the upper electrode, critical contact holes having an influence on numerous bit data must be formed more securely. If the isotropic technique is used in this case, contact holes can be formed in a small aspect ratio and with sufficient buriability.

In Embodiment 1, the contact hole having an opening of a very-small diameter in the former case is filled with a conductive material having a good buriability, such as tungsten (W). The contact hole of the latter case formed by isotropic etching is filled with a conducting material excellent in low resistivity, such as aluminium (Al), since more secure electrical contact is required in this case. If the conducting material is properly chosen as mentioned above, it is possible to form the contact hole with a proper miniaturization level, buriability, and electrical properties.

Figure 15:
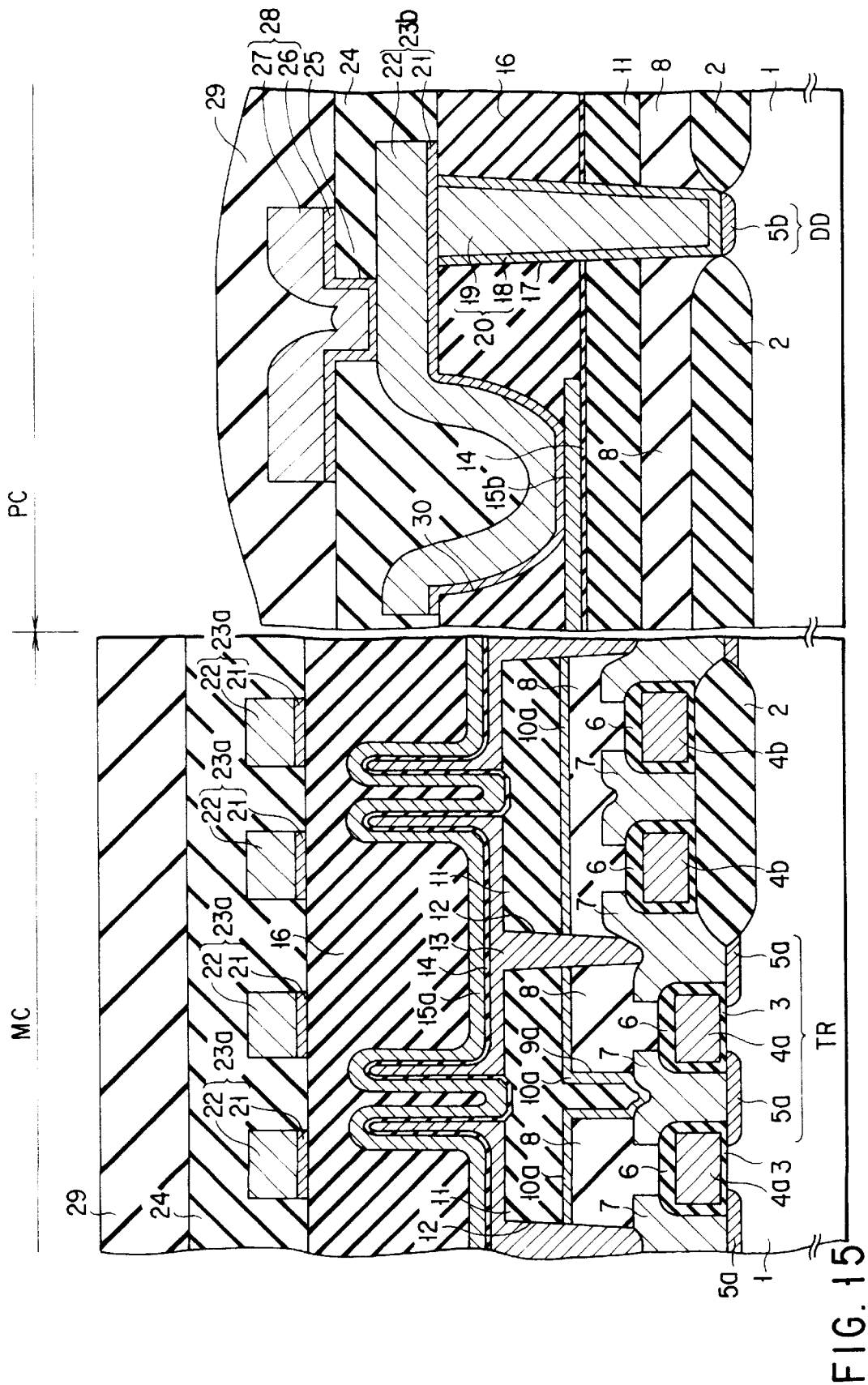
FIG. 15 is a cross-sectional view of a modified example of Embodiment 1.

The method of connecting the protecting diode is not limited to the one shown in FIG. 8. For example, as shown in FIG. 15, the contact hole 17 is formed immediately on the diffusion layer 5b to connect the conducting layer 23b directly to the diffusion layer 5b.

(Embodiment 2)

Figure 16:
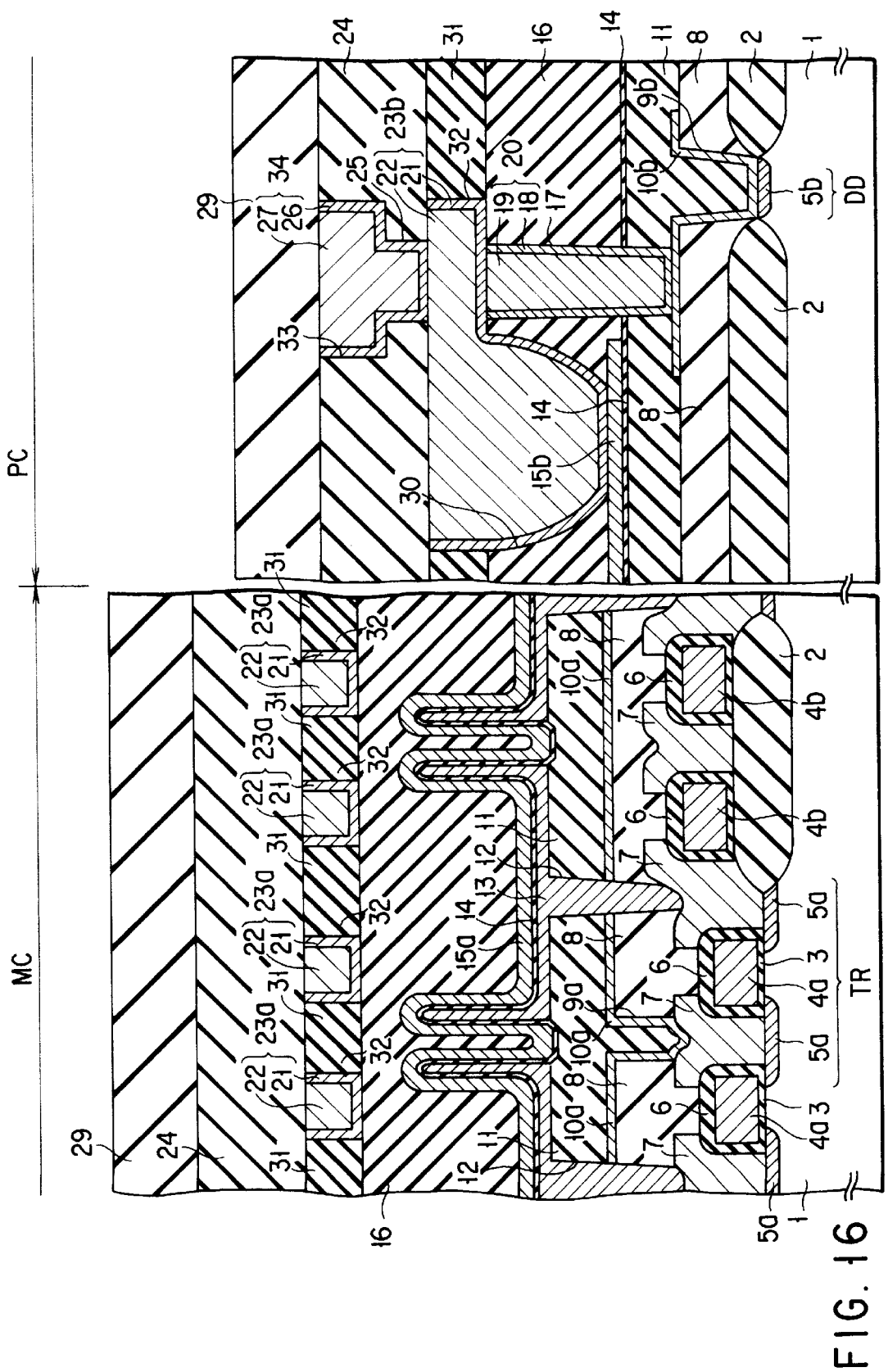
FIG. 16 is a cross-sectional view of a DRAM having a stacked capacitor according to Embodiment 2 of the present invention.

FIG. 16 is a cross-sectional view of a DRAM having a stacked capacitor according to Embodiment 2 of the present invention.

A feature of Embodiment 2 resides in that wiring is buried in the interlayer film on the capacitor upper electrodes (cell plate) 15a, 15b. Similarly to Embodiment 1, a contact hole 30 having a cone-shaped opening is formed in the interlayer insulating film 16 sandwiched by the capacitor upper electrode (cell plate) 15b and the conducting layer (first wiring layer) 23b. In addition, the capacitor upper electrode (cell plate) 15b is electrically connected to the semiconductor substrate 1 via a capacitor protecting diode DD, as is in Embodiment 1.

Figure 17:
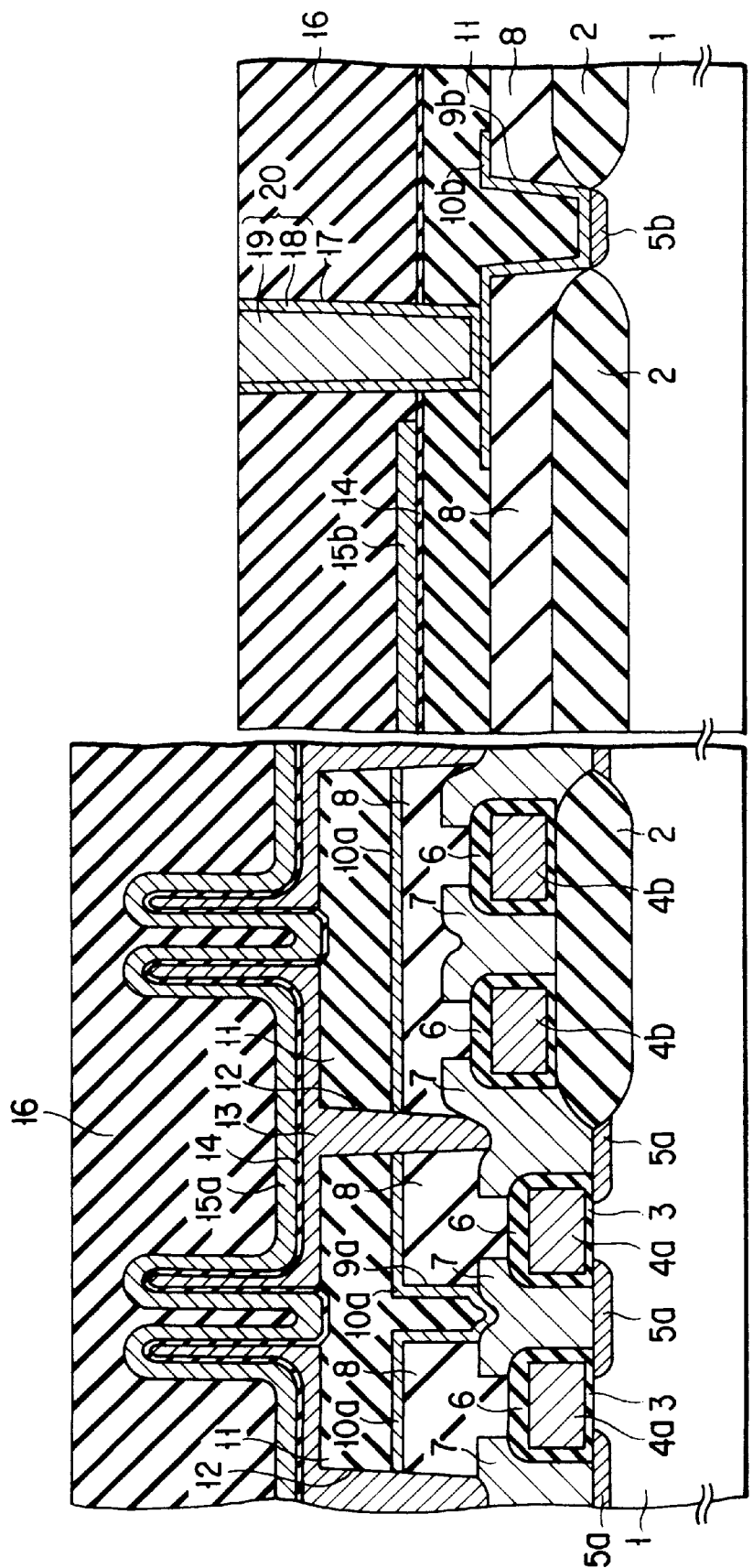
FIGS. 17–20 are cross-sectional views of a DRAM according to Embodiment 2, sequentially showing manufacturing steps thereof.

FIGS. 17–20 are cross-sectional views of the DRAM of Embodiment 2 shown in FIG. 16, sequentially showing the manufacturing steps. The steps up to FIG. 17 are the same as those up to FIG. 12 in Embodiment 1.

Figure 18:
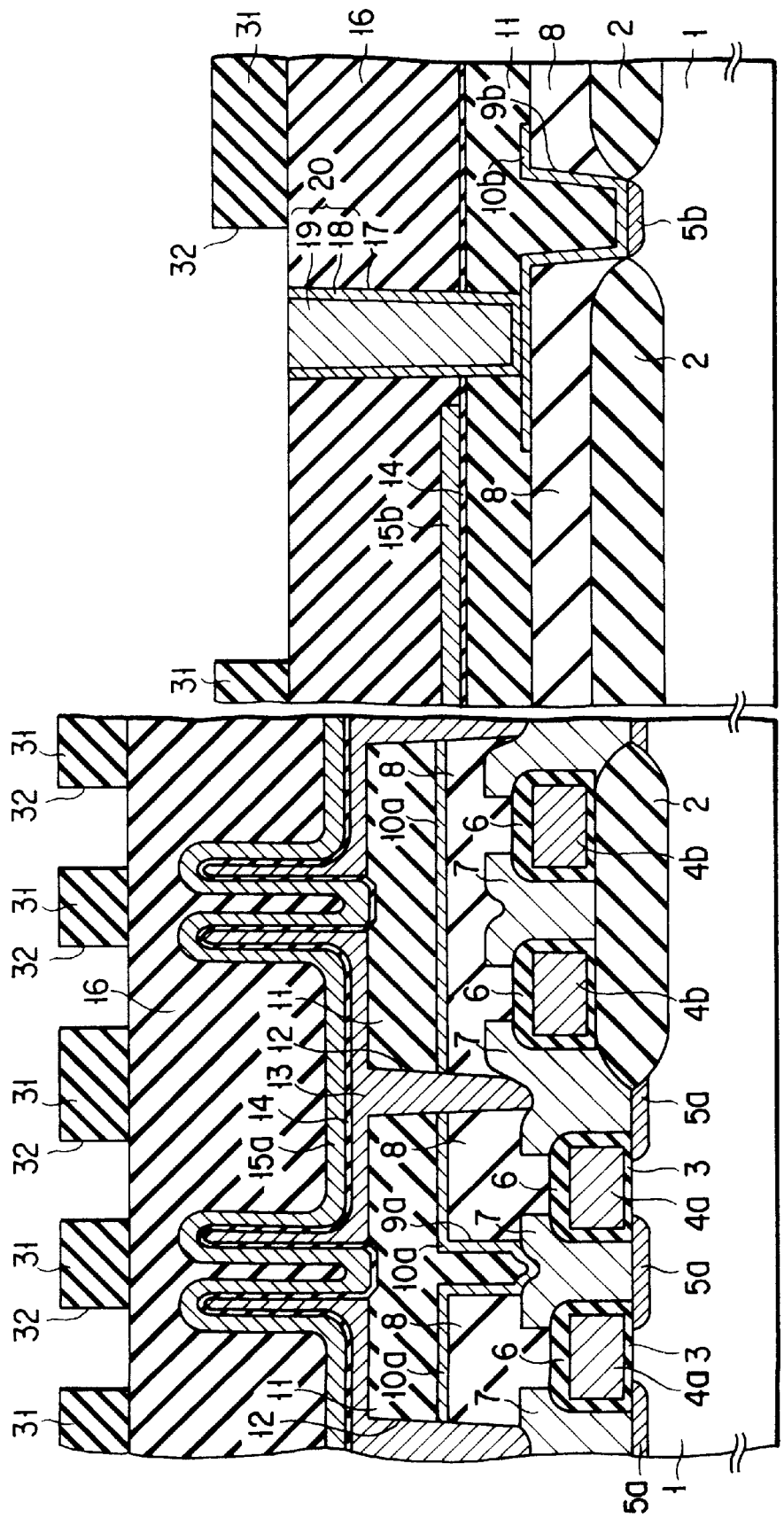

After completion of the step of FIG. 17, an interlayer insulating film 31 is formed over the entire surface, as shown in FIG. 18. Different from Embodiment 1, a contact hole 30 to the capacitor upper electrode (cell plate) 15b is not formed at this stage. Then, a wiring groove 32 is formed by a conventional lithographic technique and etching technique (RIE). At this time, the depth of the wiring groove 32 is at least deeper than that of the interlayer insulating film 31 so as to expose the upper layer of the previously-formed buried electrode 20 therein.

Figure 19:
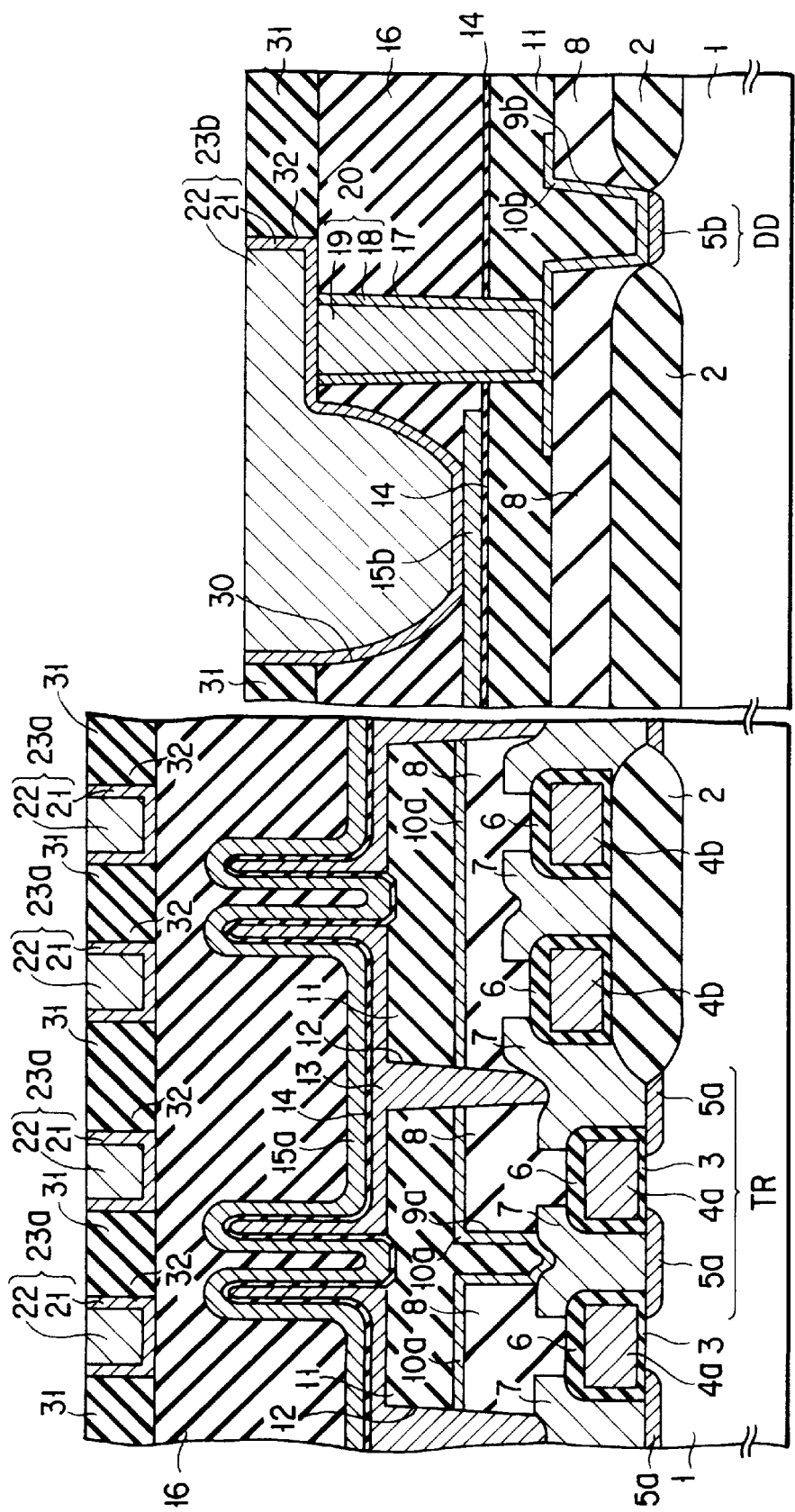

As shown in FIG. 19, to form the contact hole 30 to the capacitor upper electrode (cell plate) 15b, lithography and then isotropic etching such as wet etching or CDE (free from active ion collision) are performed. As a result, the contact hole 30 is formed.

Now, in a general buried wiring step, either the wiring groove formation step or the contact hole formation step may be formed first. However, in Embodiment 2, if the contact hole is formed first, the capacitor upper electrode (cell plate) 15b inevitably receives active ion collision in the following wiring groove formation step. Accordingly, the wiring groove formation step must precede the contact hole formation step.

Subsequently, a barrier metal layer 21 is formed and a conducting layer (aluminium) 22 is deposited. After reflow, CMP is performed using the interlayer insulating film 31 as a stopper, thereby forming conducting layers (wiring layer) 23a, 23b. At this point, the capacitor upper electrode (cell plate) 15b is electrically connected to the protecting diode DD.

Figure 20:
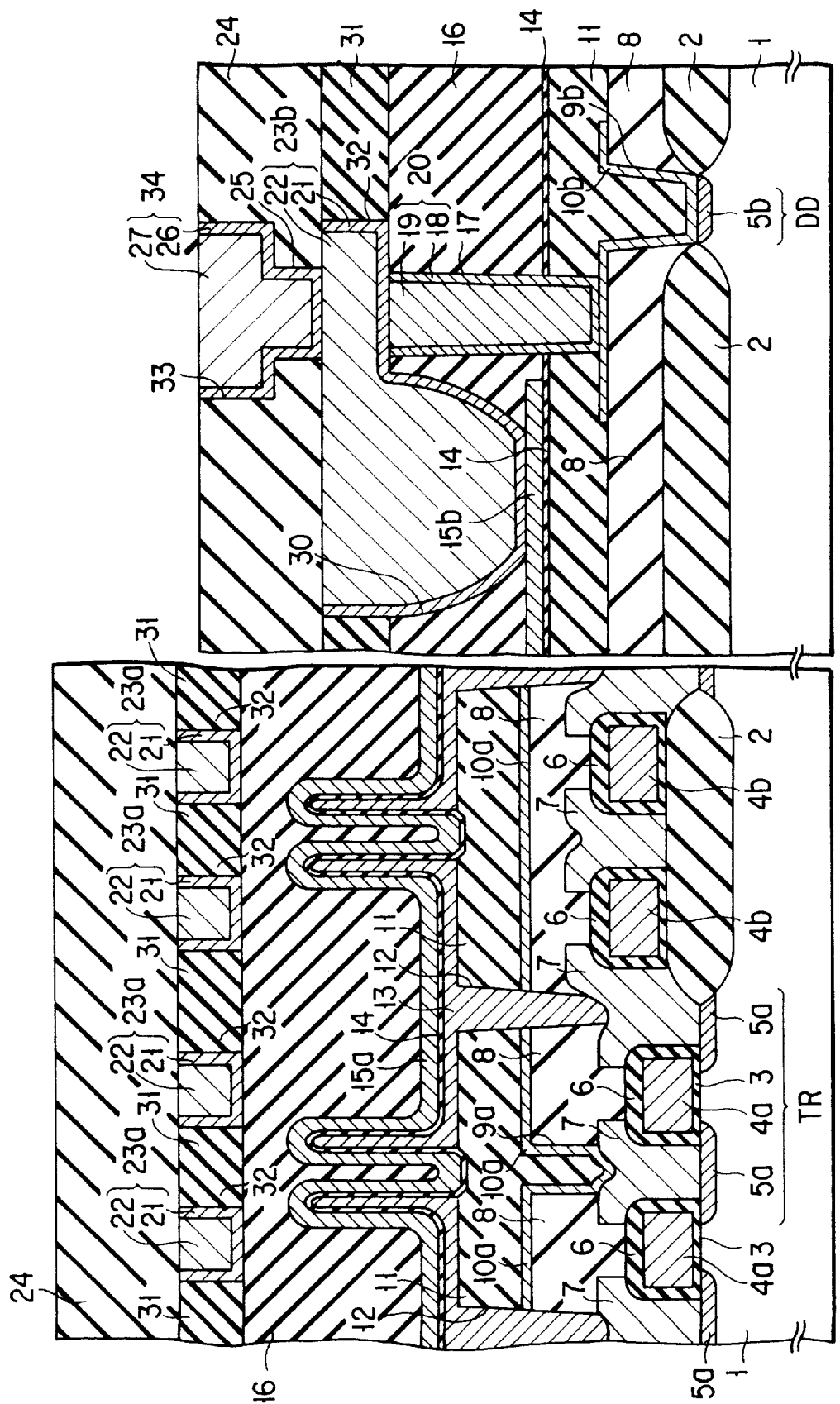

As shown in FIG. 20, an interlayer insulating film 24 is deposited, and a wiring groove 33 and a contact hole 25 serving as a second buried conducting layer (wiring layer) are formed by using a lithographic technique and etching (RIE). Then, a barrier metal layer 26 and then a conducting layer 27 is deposited. After reflow, CMP is performed using the interlayer insulating film 24 as a stopper to form a wiring layer 34 serving as a second buried conducting layer.

As described, different from Embodiment 1, the buried wiring formation step is employed in Embodiment 2. To describe more specifically, after the buried electrode 20 is formed in FIG. 17, the interlayer insulating film 31 is deposited and a wiring groove 32 to be filled with a first buried conducting layer (wiring layer) is formed. Subsequently, the contact hole 30 in contact with the capacitor upper electrode (cell plate) 15b is formed by isotropic etching free from accelerated ions collision. After the conducting layer 22 is deposited over the entire surface, CMP is applied. As a result, the capacitor upper electrode (cell plate) 15b is electrically connected to a protecting diode DD.

By virtue of the steps mentioned above, the resultant structure is excellent in planarity of surface in Embodiment 2. This is another effect of Embodiment 2 in addition to the first, second, and third effects obtained in Embodiment 1. Since the buried conducting layer (first wiring layer) is filled with burying the conducting layer 22 without fail, highly reliable electrical contact can be ensured. Hence, even if a miniaturization level is advanced with an increase in the integration level of the semiconductor memory device, electrical contact of desired conducting layers can be ensured through the contact hole. As a result, the semiconductor memory device and the manufacturing method of the semiconductor memory device can be provided in a high yield and with a high reliability.

(Embodiment 3)

Figure 21:
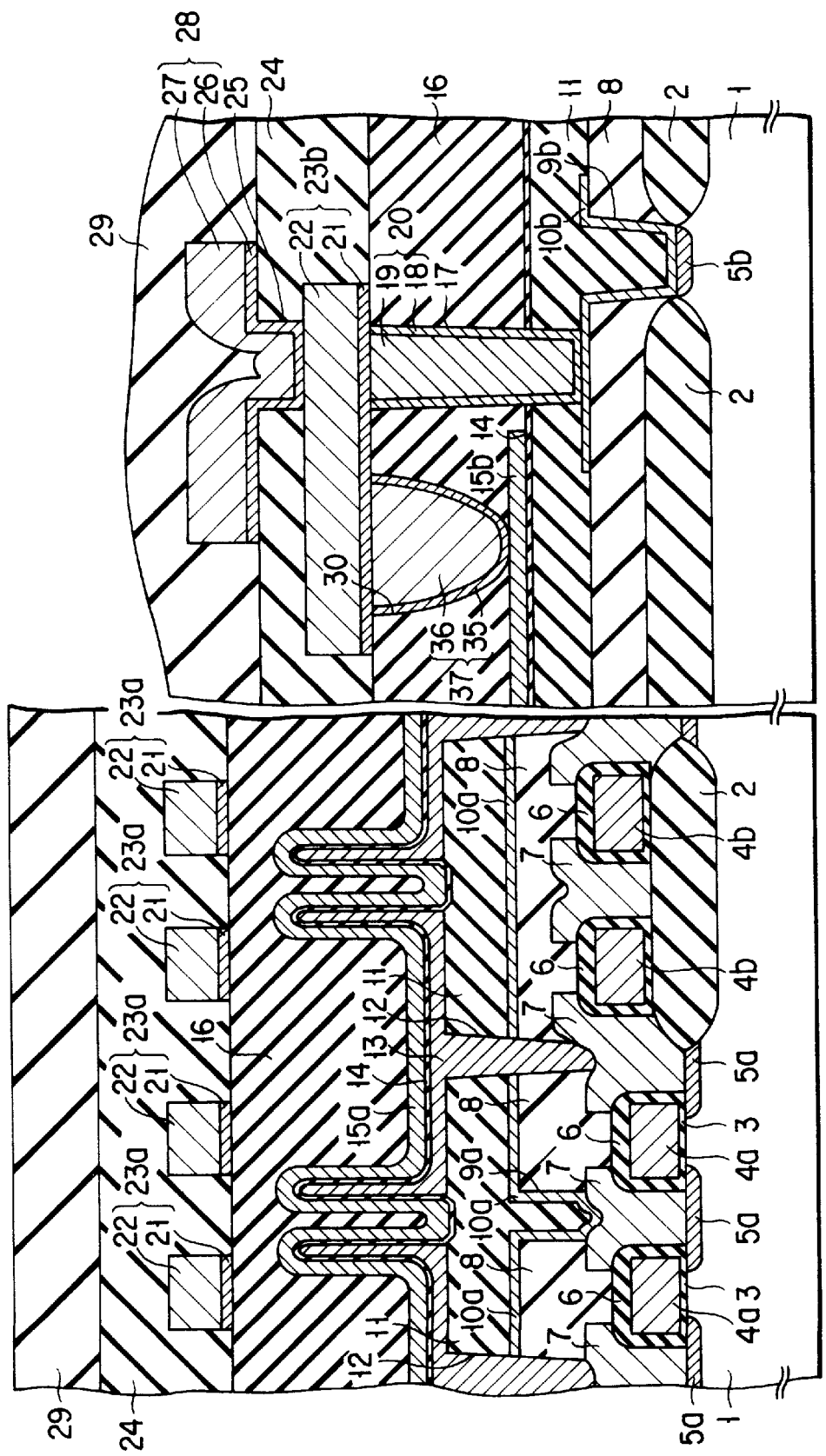
FIG. 21 is a cross-sectional view of a DRAM having a stacked capacitor according to Embodiment 3 of the present invention.

FIG. 21 is a cross-sectional view of a DRAM having a stacked capacitor according to Embodiment 3.

A feature of Embodiment 3 resides in that a lower area of a trench 30 formed in an interlayer insulating film 16 of the PC region is formed by isotropic etching such as wet etching or CDE (free from accelerated ion collision) imparting no electrical potential variation to the capacitor upper electrode (cell plate) 15b, and that the upper area is formed by anisotropic etching. The capacitor upper electrode (cell plate) 15b is electrically connected to the semiconductor substrate 1 via a capacitor protecting diode DD in the same manner as Embodiment 1.

Figure 22:
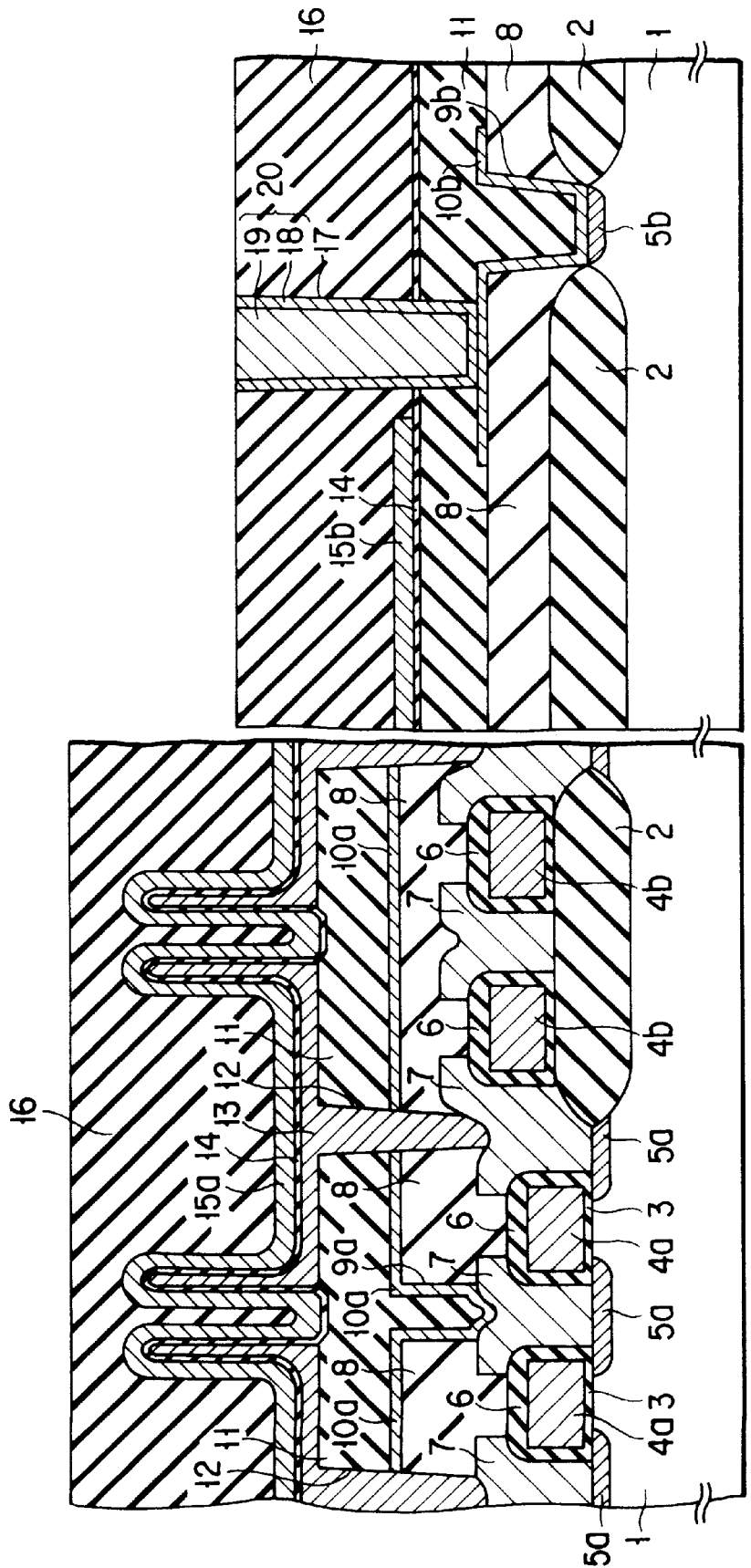
FIGS. 22–25 are cross-sectional views of a DRAM according to Embodiment 3, sequentially showing manufacturing steps thereof.

FIGS. 22–25 are cross-sectional views of a DRAM according to Embodiment 3, shown in FIG. 21, sequentially showing manufacturing steps. The steps up to FIG. 22 are the same as those up to FIG. 12 of Embodiment 1.

Figure 23:
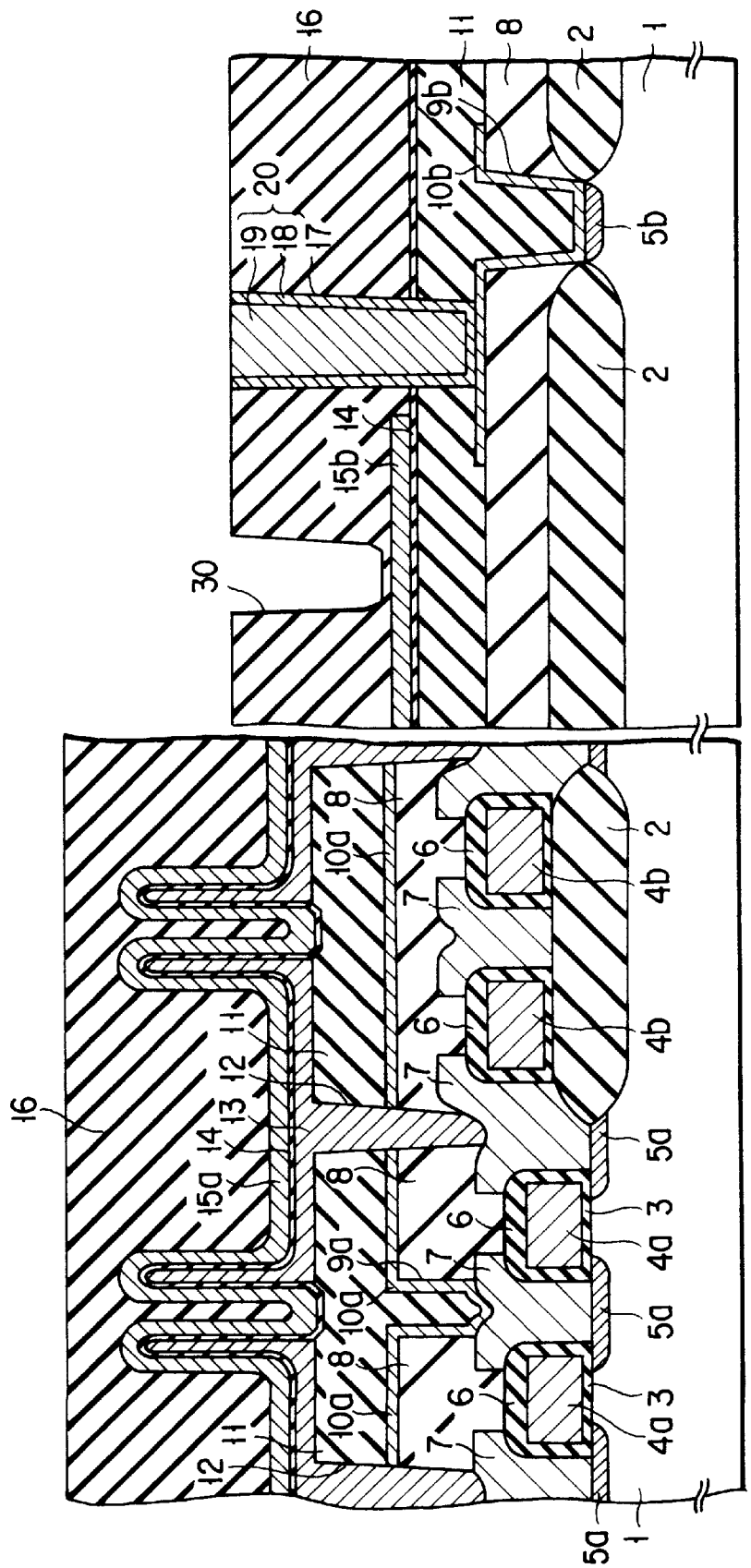

After completion of the step of FIG. 22, an etching mask (not shown) is formed for forming a contact hole 30 to a capacitor upper electrode (cell plate) 15b, as shown in FIG. 23. Then, a trench 30 is formed by anisotropic etching without passing through an interlayer insulating film 16, (in other words, in such a way that the interlayer insulating film 16 is left on the capacitor upper electrode 15b).

Figure 24:
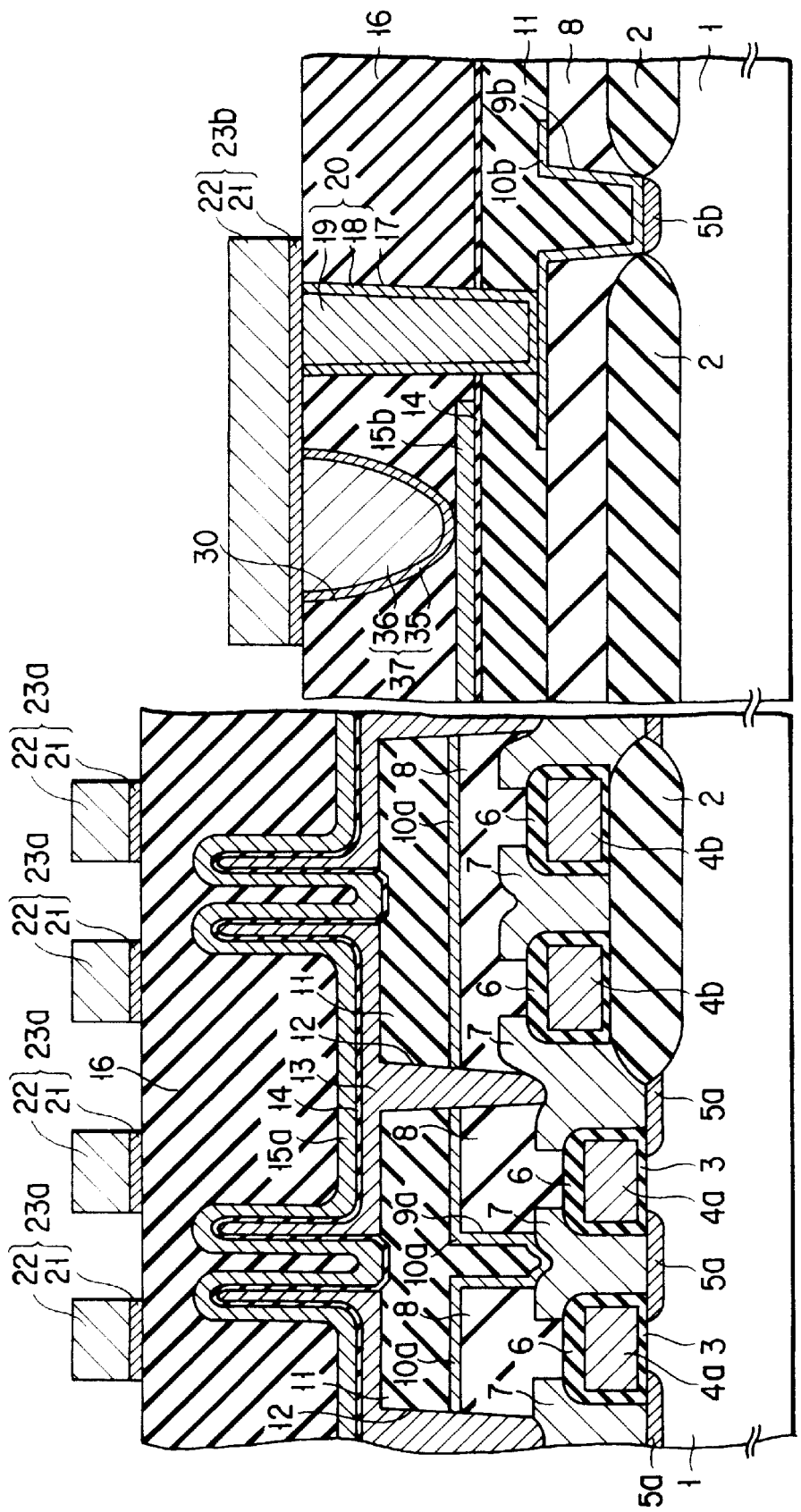
Figure 25:
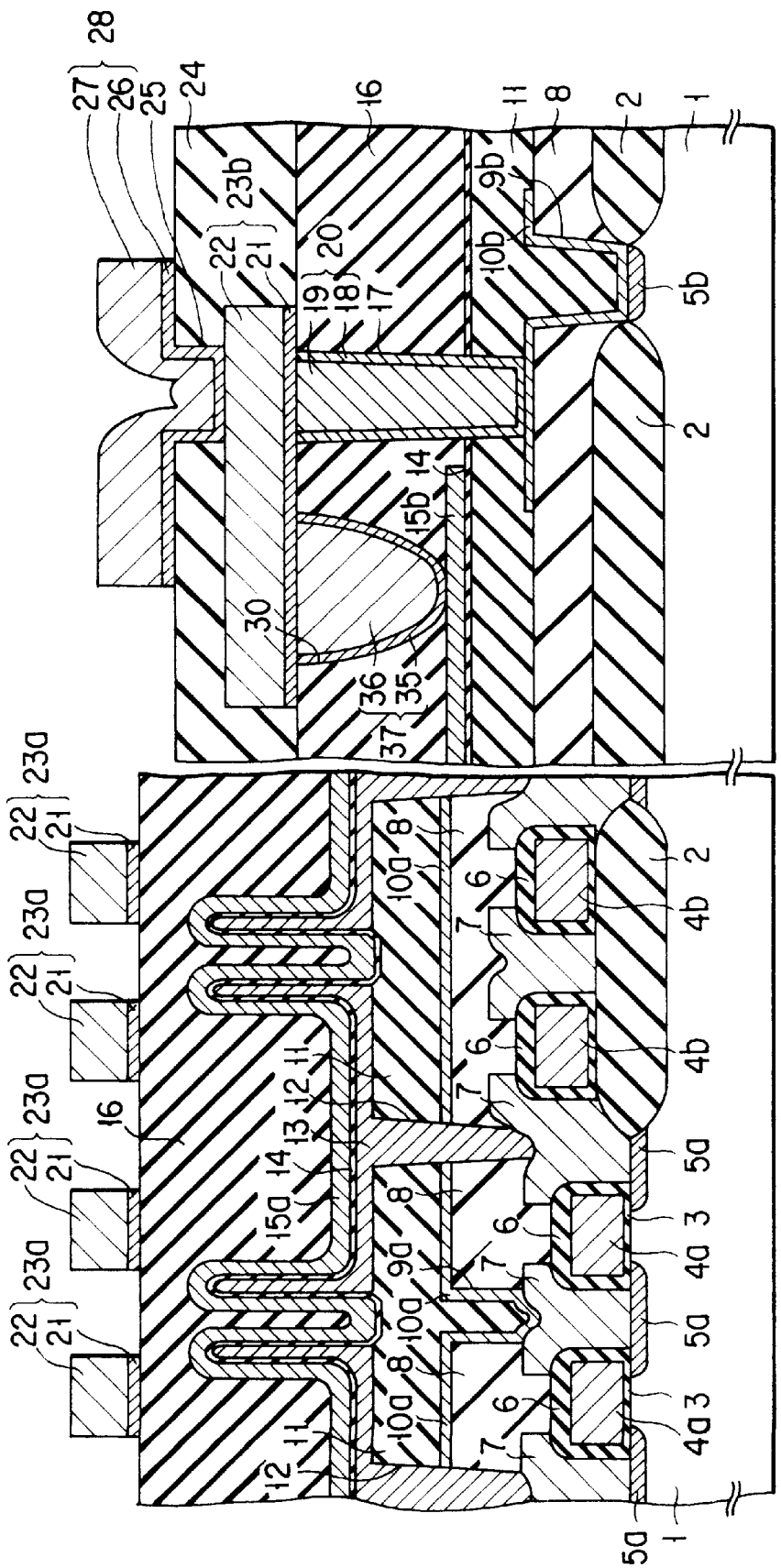

As shown in FIG. 24, the lower area of a trench 30 is isotropically etched by wet etching or CDE (free from reactive ion collision). As a result, a trench 30 extending to a surface of the capacitor upper electrode 15b is formed. After a barrier metal layer 35 (a Ti/TiN stacked film) is deposited in the same manner as in Embodiment 1, a conducting layer 36 (tungsten, W) is deposited. After the surface of the resultant structure is planarized by CMP to form a buried electrode 37. Subsequently, a conducting layer (first wiring layer) 23b is formed so as to electrically connect the capacitor upper electrode (cell plate) 15b to the buried electrode 20, in the same manner as in Embodiment 1. The steps after and including FIG. 25 are the same as the steps after and including FIG. 14 of Embodiment 1. In Embodiment 3, the same effects as the first, second, and third effects of Embodiment 1 can be obtained.

Figure 26:
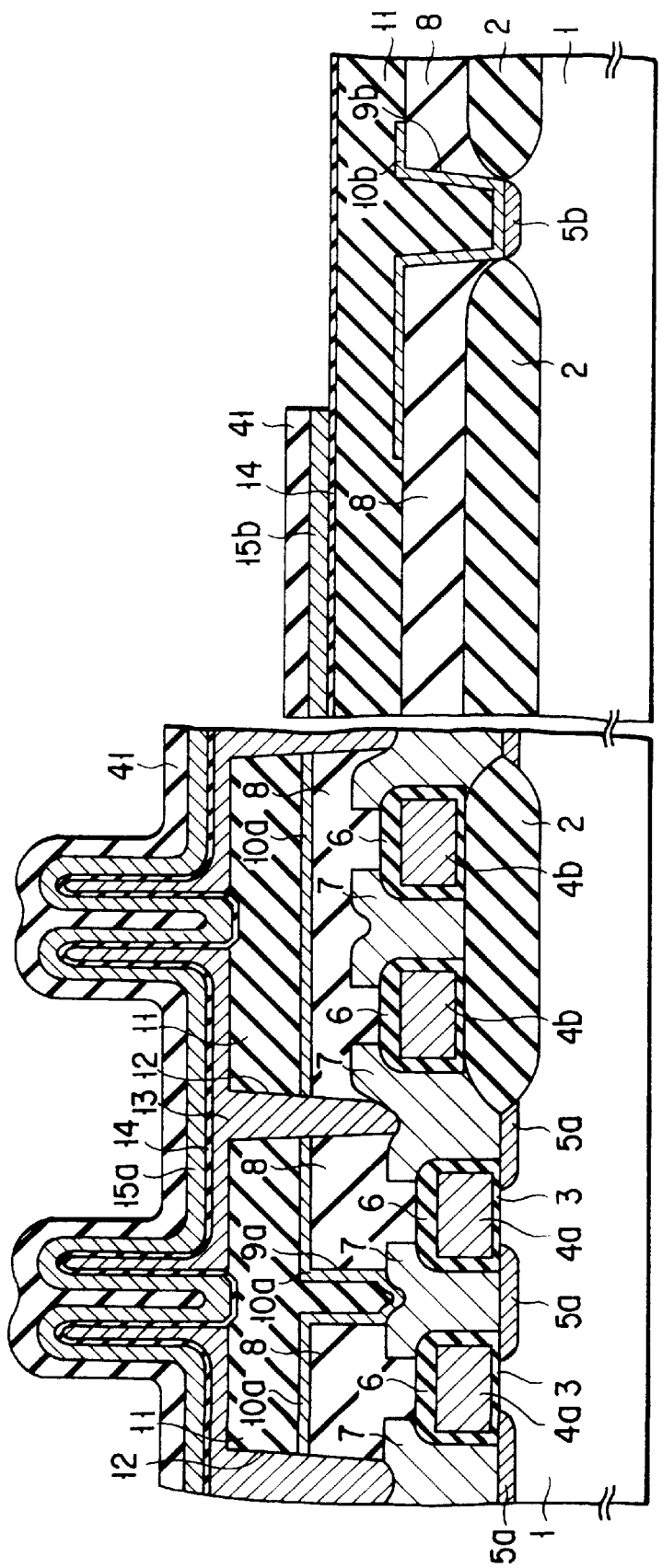
FIGS. 26–28 are cross-sectional views of a DRAM sequentially showing manufacturing steps of a modified example of Embodiment 3.
Figure 27:
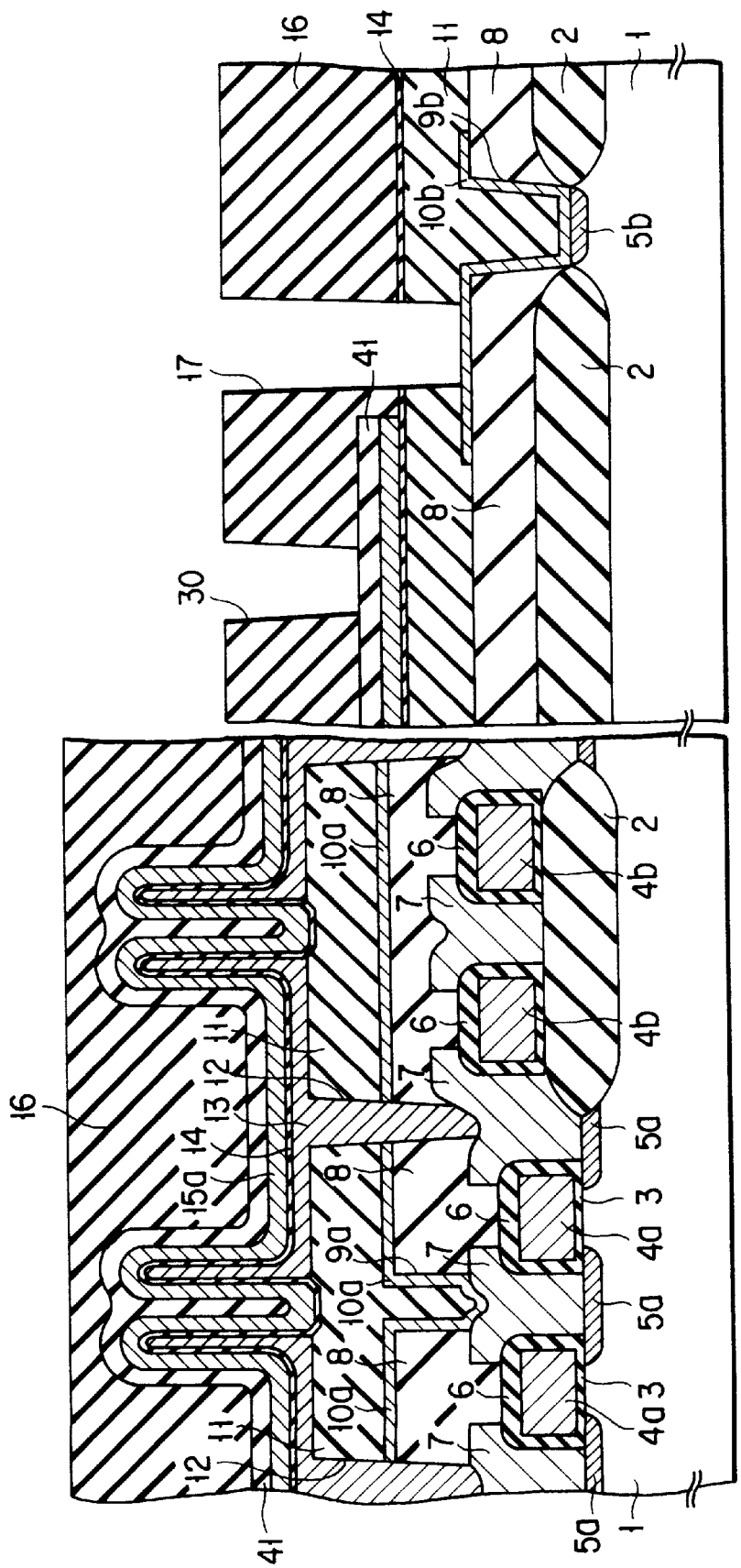

Note that Embodiment 3 can be modified as described below. After completion of the step of FIG. 11 in Embodiment 1, a thin nitride film 41 is formed on the upper electrode (cell plate) 15b as shown in FIG. 26. As shown in FIG. 27, a contact hole 17 and a contact hole 30 are anisotropically etched at the same time. In this step, the nitride film 41 works as an etching stopper for the contact hole 30. The thin nitride film 41 alone is selectively and isotropically etched, with the result that the contact hole 30 extending to the surface of the capacitor upper electrode 15b is formed.

Figure 28:
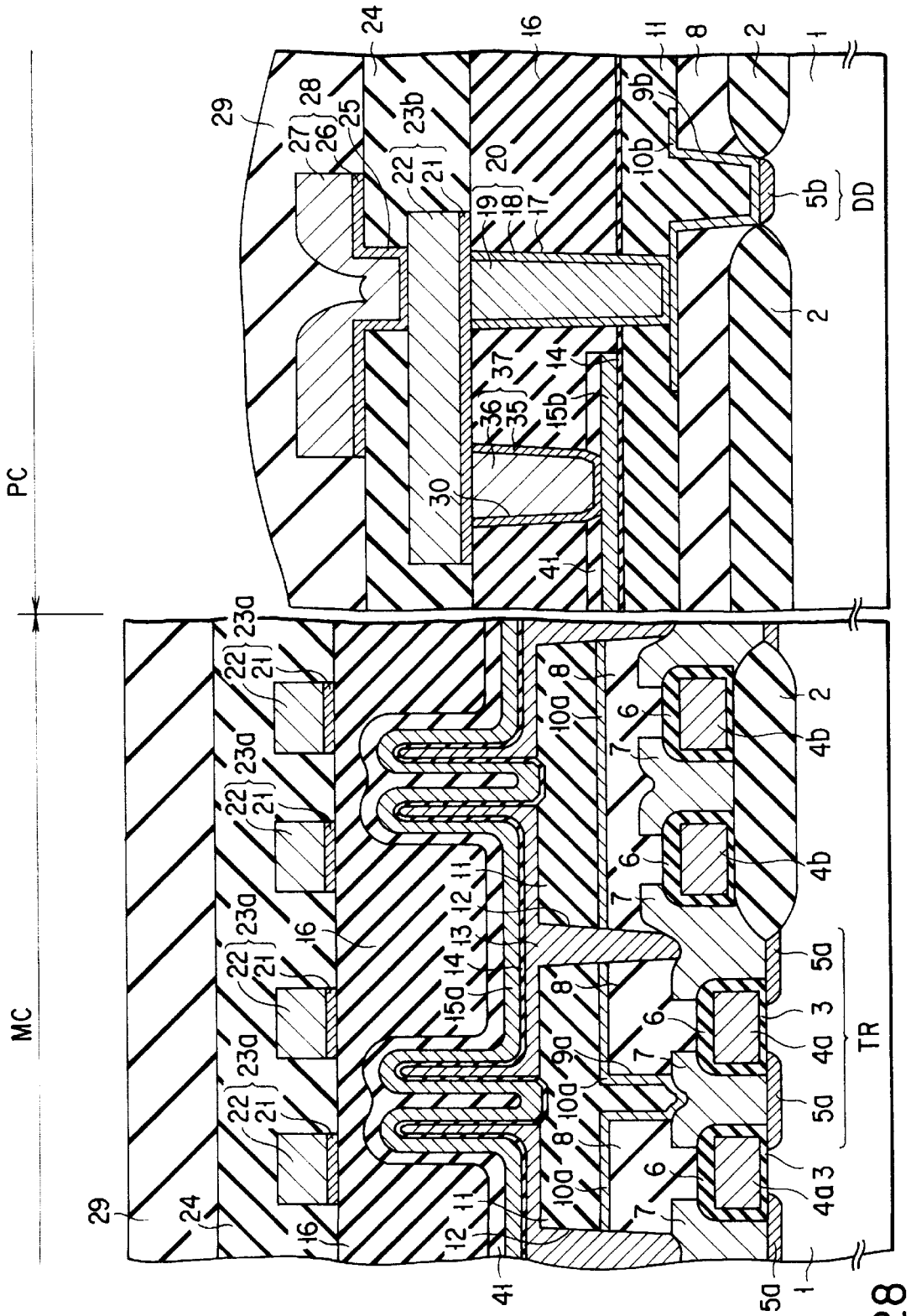

Thereafter, conducting layers 20 and 37 composed of barrier metals 18, 35 and tungsten layers 19, 36 are formed respectively and simultaneously in a contact holes 17 and 30. Thereafter, the steps after and including the step of FIG. 24 as to Embodiment 3 are carried out. As a result, the DRAM shown in FIG. 28 is completed.

If the contact hole 30 is formed as described above, the lithographic steps (for forming the contact holes 17 and 30), the barrier metal deposition step, a tungsten (W) deposition step, a tungsten-layer stacking step, and a CMP step, which have been hitherto performed respectively for the contact holes 17 and 30, can be commonly performed. As a result, entire manufacturing steps are reduced in number. In this case, the step newly added to the manufacturing step is only nitride film formation step.

Now, there will be described how to form the nitride film 41 more specifically. After the step of FIG. 11, the thin nitride film 41 is deposited on the upper electrode (cell plate) 15b and patterned into the shape of the upper electrode 15b by using low-damage etching. Alternatively, the nitride film 4 is formed over the entire surface immediately after the formation of a conducting film serving as the upper electrode 15b, and the conducting film and the nitride film 41 may be patterned into the shape of the upper electrode 15b, simultaneously.

In the common step of forming contact holes 17 and 30, the upper electrode 15b is not damaged during RIE performed after the etching mask formation, since the upper electrode (cell plate) 15b underlying the contact hole 30 is protected by the nitride film 41. Furthermore, the common step is successfully performed if the later wet etching is performed in such a way that the nitride film 41 is selectively etched but oxide films (interlayer insulating film 11, 16) are not etched.

In Embodiments 1, 2, and 3, the capacitor upper electrodes (cell plate) 15a, 15b and the capacitor storage electrode (storage node) 13 may be formed of an element selected from the group consisting of Ru, Pt, Re, Os, Rh, Ir, one of oxides of the elements mentioned or alloys and oxides of the alloys. Furthermore, they may be formed of an element selected from the group consisting of W, Nb, Al, Ti, Ta, to, Cu, WN, NbN, TiN, N, TaN, Pd, $SrRuO_3$, or the like. The dielectric film 14 is formed of (Ba, $Sr)TiO_3$, $BaTiO_3$, $SrTiO_3$, $PbZrO_3$, $LiNbO_3$, $Bi_4Ti_3O_{12}$, $Ta_2O_5$, and the like.

In general, the capacitance is given by the equation:

$$C = \epsilon \times S/d$$

where $\epsilon$ is a dielectric constant; S is an electrode area; d is a thickness of a capacitor dielectric film.

According to the equation, capacitance can be increased if the dielectric constant is increased, the electrode area is increased, or the thickness of a capacitor dielectric film is reduced. Hence, it is possible to change a material relevant to these factors and the film constitution. To increase the dielectric constant, various materials are tested. As another possibility, a ferroelectric film or a high dielectric film may be used. Alternatively, an $SiO_2$ (silicon oxide) film and an $Si_3N_4$ (silicon nitride) film conventionally used, and a multilayered structure of these films may be employed.

In Embodiments 1 and 2, aluminium is used as the material for the buried conducting layer used in the contact hole on the capacitor upper electrode (cell plate) 15b. Tungsten is used as the material to be used in the contact hole on the conducting layer (second wiring layer) 10b formed in the peripheral circuit region. Low resistivity intrinsic to aluminium and good buriability to tungsten are preferentially adapted to the requirement for each of contact holes. Other materials will be applicable.

Furthermore, it is easy to modify embodiments in various ways as mentioned below. To increase capacitor electrode area, various shapes of the electrode may be employed other than a cylindrical form shown in embodiments. Examples of the shapes include a thick-film form and a fin shape. Needless to say, the modification to the electrode includes surface modification (rendering the surface rough) in combination with shape modification.

On the basis of technical ideas of the present invention, various modifications may be made with respect to the material, a compositional ratio of the material, a conductive type, positional relationship among structures, and the order of the manufacturing steps. The materials used in the insulating film, the capacitor upper electrode (cell plate), the capacitor storage electrode (storage node electrode), the capacitor dielectric film, and the wiring in the peripheral circuit, are not limited to those set forth in the embodiments. The presence and absence of the barrier metal layer or the like, addition of a processing step, connection between elements in the memory cell region and the peripheral circuit region and positional relationship among elements, structures other than COB and a diode structure, may not be limited to those set forth in the embodiments.

The present invention may be applied to semiconductor memory devices other than the DRAM. Other than a stacked type semiconductor memory devices, the present invention can be applied not only to the cases in which a plurality of contact holes different in depth are formed in the same plane of the interlayer film and formed simultaneously in the same method, but also to the cases in which each of contact holes has to be formed in a proper over-etching amount.

According to the present invention, an etching factor such as an over-etching amount can be properly set in a step of forming a plurality of contact holes different in depth. It is therefore possible to prevent damage due to etching. Furthermore, if the present invention is applied to forming a contact hole to the capacitor upper electrode (cell plate), it is possible to avoid electrical potential variation to the capacitor upper electrode (cell plate). As a result, the semiconductor memory device can be realized in a high yield and with high reliability while reducing damages to the capacitor dielectric film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a semiconductor substrate having a main surface;
   a first conducting layer formed above the main surface of the semiconductor substrate;
   a second conducting layer formed above the first conducting layer with a first insulating layer interposed therebetween and connected to the first conducting layer through a first via-conductor formed in a first contact hole formed in the first insulating layer; and
   a third conducting layer formed beneath the second conducting layer with the first insulating layer and a second insulating layer interposed therebetween and connected to the second conducting layer through a second via-conductor formed in a second contact hole formed in the first and second insulating layers;
   wherein the wall of the first contact hole has a substantially arcuate profile in an area other than an uppermost and a lowermost portion of the first contact hole in a cross section taken on a center line of a vertical direction of the first contact hole, and the wall of the second contact hole has a substantially straight wall profile in an area other than an uppermost and a lowermost portion of the second contact hole in a cross section taken on a center line of a vertical direction of the second contact hole.

2. The semiconductor memory device according to claim 1, wherein the first conducting layer serves as one of two electrodes of a capacitor formed on the main surface of the semiconductor substrate.

3. The semiconductor memory device according to claim 1, further comprising means for electrically connecting the first conducting layer to the semi-conductor substrate which operates when a voltage over a predetermined voltage is applied to the first conducting layer.

4. The semiconductor memory device according to claim 1, further comprising a protection diode formed between said second via-conductor and the semiconductor substrate to release extra charge generated on the first conducting layer.

5. The semiconductor memory device according to claim 1, wherein the first via-conductor is formed of a different material from a material of the second via-conductor.

6. A semiconductor memory device comprising:
   a semiconductor substrate having a main surface;
   a capacitor storage electrode formed above the main surface of the semiconductor substrate;
   a capacitor upper electrode formed above the capacitor storage electrode through a capacitor dielectric film;
   a first wiring layer formed above the capacitor upper electrode with a first insulating layer interposed therebetween and connected to the capacitor upper electrode through a first via-conductor formed in a first contact hole formed in the first insulating layer; and
   a second wiring layer formed beneath the first wiring layer with the first insulating layer and a second insulating layer interposed therebetween and connected to the first wiring layer through a second via-conductor formed in a second contact hole formed in the first and second insulating layers,
   wherein the wall of the first contact hole has a substantially arcuate profile in an area other than an uppermost and a lowermost portion of the first contact hole in a cross section taken on a center line of a vertical direction of the first contact hole, and the wall of the second contact hole has a substantially straight profile in an area other than an uppermost and a lowermost portion of the second contact hole in a cross section taken on a center line of a vertical direction of the second contact hole.

7. The semiconductor memory device according to claim 6, wherein further comprising means for electrically connecting the capacitor upper electrode to the semiconductor substrate which operates when a voltage over a predetermined voltage is applied to the capacitor upper electrode.

8. The semiconductor memory device according to claim 6, further comprising a protection diode formed between said second via-conductor and the semiconductor substrate to release extra charge generated on the capacitor upper electrode.

9. The semiconductor memory device according to claim 6, wherein the first via-conductor is formed of a different material from a material of the second via-conductor.

10. The semiconductor memory device according to claim 6, wherein the capacitor dielectric film includes one selected from the group consisting of $(Ba,Sr)TiO_3$, $BaTiO_3$, $SrTiO_3$, $PbZrO_3$, $LiNbO_3$, $Bi_4Ti_3O_{12}$, and $Ta_2O_5$.

11. A semiconductor memory device comprising:

a semiconductor substrate having a main surface;

a capacitor storage electrode formed above the main surface of the semiconductor substrate;

a capacitor upper electrode formed above the capacitor storage electrode through a capacitor dielectric film;

a first wiring layer formed above the capacitor upper electrode with a first insulating layer interposed therebetween and connected to the capacitor upper electrode through a first via-conductor formed in a first contact hole formed in the first insulating layer; and a second insulating layer interposed between the semiconductor substrate and the first insulating layer, wherein the first wiring layer is coupled to the semiconductor substrate through a second via-conductor formed in a second contact hole formed in the first and second insulating layers;

wherein the wall of the first contact hole has a substantially curved profile in an area other than an uppermost and a lowermost portion of the first contact hole in a cross section taken on a center line of a vertical direction of the first contact hole, and the wall of the second contact hole has a substantially straight profile in an area other than an uppermost and a lowermost portion of the second contact hole in a cross section taken on a center line of a vertical direction of the second contact hole.

12. The semiconductor memory device of claim 11, wherein the semiconductor substrate is coupled to the second via-conductor through a protection diode.

* * * * *